United States Patent
Hiraku

(10) Patent No.: US 10,476,511 B2
(45) Date of Patent: Nov. 12, 2019

(54) PLL CIRCUIT, SEMICONDUCTOR DEVICE INCLUDING THE SAME, AND CONTROL METHOD OF PLL CIRCUIT

(71) Applicant: RENESAS ELECTRONICS CORPORATION, Tokyo (JP)

(72) Inventor: Yasuyuki Hiraku, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/250,414

(22) Filed: Jan. 17, 2019

(65) Prior Publication Data

US 2019/0268006 A1    Aug. 29, 2019

(30) Foreign Application Priority Data

Feb. 23, 2018 (JP) .................................. 2018-030840

(51) Int. Cl.
   *H03L 7/08*    (2006.01)
   *H03L 7/089*   (2006.01)
   *H03L 7/099*   (2006.01)
   *H03L 7/097*   (2006.01)

(52) U.S. Cl.
   CPC ............ *H03L 7/0891* (2013.01); *H03L 7/097* (2013.01); *H03L 7/099* (2013.01)

(58) Field of Classification Search
   CPC ........ H03L 7/0891; H03L 7/099; H03L 7/097
   See application file for complete search history.

(56) References Cited

U.S. PATENT DOCUMENTS

| 5,942,949 | A  | * | 8/1999  | Wilson   | H03L 7/087 327/157 |
| 6,259,755 | B1 | * | 7/2001  | O'Sullivan | H03L 7/087 375/376 |
| 6,489,851 | B1 | * | 12/2002 | Miyada   | H03L 7/087 327/156 |
| 7,135,900 | B2 | * | 11/2006 | Sohn     | H03L 7/0891 327/148 |
| 8,040,191 | B2 |   | 10/2011 | Hirai    |            |
| 2017/0194972 | A1 | * | 7/2017  | Sai      | H03K 5/26  |
| 2019/0081560 | A1 | * | 3/2019  | Mahmoud  | H02M 3/07  |
| 2019/0097638 | A1 | * | 3/2019  | Liu      | H03L 7/0807 |

FOREIGN PATENT DOCUMENTS

JP              5448870 B2      3/2014

* cited by examiner

*Primary Examiner* — Kenneth B Wells
(74) *Attorney, Agent, or Firm* — McDermott Will & Emery LLP

(57) ABSTRACT

A PLL circuit includes a phase comparator, first and second charge pumps, a filter generating a first control voltage from a current of the first charge pump, a comparator comparing a voltage of a first node with a reference voltage, a switch section outputting the reference voltage to the first node and outputting a current of the second charge pump to a second node in a high-speed lock mode, and outputting the current of the second charge pump to the first node and outputting a result from the comparator to the second node in a normal lock mode, a second filter generating a second control voltage by integrating a current of the first node, a third filter generating a third control voltage by integrating a current of the second node, and a voltage controlled oscillator generating a clock signal of a frequency corresponding to the first to third control voltages.

20 Claims, 34 Drawing Sheets

PLL CIRCUIT, SEMICONDUCTOR DEVICE INCLUDING THE SAME, AND CONTROL METHOD OF PLL CIRCUIT

CROSS-REFERENCE TO RELATED APPLICATIONS

The disclosure of Japanese Patent Application No. 2018-030840 filed on Feb. 23, 2018 including the specification, drawings and abstract is incorporated herein by reference in its entirety.

BACKGROUND

The present invention relates to a PLL circuit, a semiconductor device including the same, and a control method of a PLL circuit, and for example, relates to a PLL circuit, a semiconductor device including the same, and a control method of a PLL circuit, which are suitable for quickly locking a phase.

The PLL circuit is required to reduce jitter of an output clock signal as much as possible. A solution to such a requirement is disclosed in Japanese Patent No. 5448870.

The PLL circuit disclosed in Japanese Patent No. 5448870 includes a phase comparator that compares a reference signal with a feedback signal of an oscillation signal, first and second charge pumps, each of which outputs a current according to a comparison result of the phase comparator, an integrating filter that generates a first voltage signal by filtering a signal generated based on an output current of the first charge pump, a ripple filter that generates a second voltage signal by filtering a signal generated based on an output current of the second charge pump, a comparator that compares the first voltage signal generated by the integrating filter with a reference voltage, a second integrating filter that generates a third voltage signal by filtering a comparison result of the comparator, and a voltage controlled oscillation circuit that generates an oscillation signal of an oscillation frequency according to the first to the third voltage signals. Thereby, the PLL circuit can adjust an offset component of the oscillation frequency by the third voltage signal, so that it is considered that the PLL circuit can suppress increase of jitter of the oscillation signal (output clock signal).

SUMMARY

By the way, in the case of the PLL circuit of the related art, a response speed of control of the oscillation frequency by the third voltage signal is required to be set sufficiently slower than a response speed of control of the oscillation frequency by the first and the second voltage signals in order to ensure stability of the PLL circuit. Therefore, in a configuration of the PLL circuit of the related art, there is a problem that a phase cannot be quickly locked because the phase is locked after the PLL circuit is activated and the control of the oscillation frequency by the third voltage signal is completed. The other problems and novel features will become apparent from the description of the present specification and the accompanying drawings.

According to an embodiment, a PLL circuit includes a phase comparator that compares phases of a reference clock signal and a feedback clock signal, a first charge pump that generates a first current corresponding to a result of comparison by the phase comparator, a second charge pump that generates a second current corresponding to the result of comparison by the phase comparator, a first filter that generates a first control voltage obtained by removing ripple noise from a voltage generated based on the first current, a comparator that compares a voltage of a first node with a reference voltage, a switch section that selects and outputs the reference voltage to the first node and selects and outputs the second current to the second node in the case of a first mode and selects and outputs the second current to the first node and selects and outputs a result of comparison by the comparator to the second node in the case of a second mode, a second filter that generates a second control voltage by integrating a current flowing through the first node, a third filter that generates a third control voltage by integrating a current flowing through the second node, a voltage controlled oscillator that generates an output clock signal of a frequency corresponding to the first to the third control voltages, and a frequency divider that frequency-divides the output clock signal and outputs the frequency-divided output clock signal as the feedback clock signal.

According to another embodiment, a control method of a PLL circuit includes outputting a comparison result by comparing phases of a reference clock signal and a feedback clock signal, generating a first current according to the comparison result, generating a second current according to the comparison result, generates a first control voltage obtained by removing ripple noise from a voltage generated based on the first current, selecting a reference voltage and outputting the reference voltage to a first node as well as selecting the second current and outputting the second current to a second node in a first mode and selecting the second current and outputting the second current to the first node as well as selecting a comparison result between a voltage of the first node and the reference voltage and outputting the comparison result to the second node in a second mode, generating a second control voltage by integrating a current flowing through the first node, generating a third control voltage by integrating a current flowing through the second node, generating an output clock signal of a frequency corresponding to the first to the third control voltages, and frequency-dividing the output clock signal and outputting the frequency-divided output clock signal as the feedback clock signal.

According to the embodiments described above, it is possible to provide a PLL circuit, a semiconductor device including the PLL circuit, and a control method of a PLL circuit, which can quickly lock a phase.

DETAILED DESCRIPTION

Figure 1:
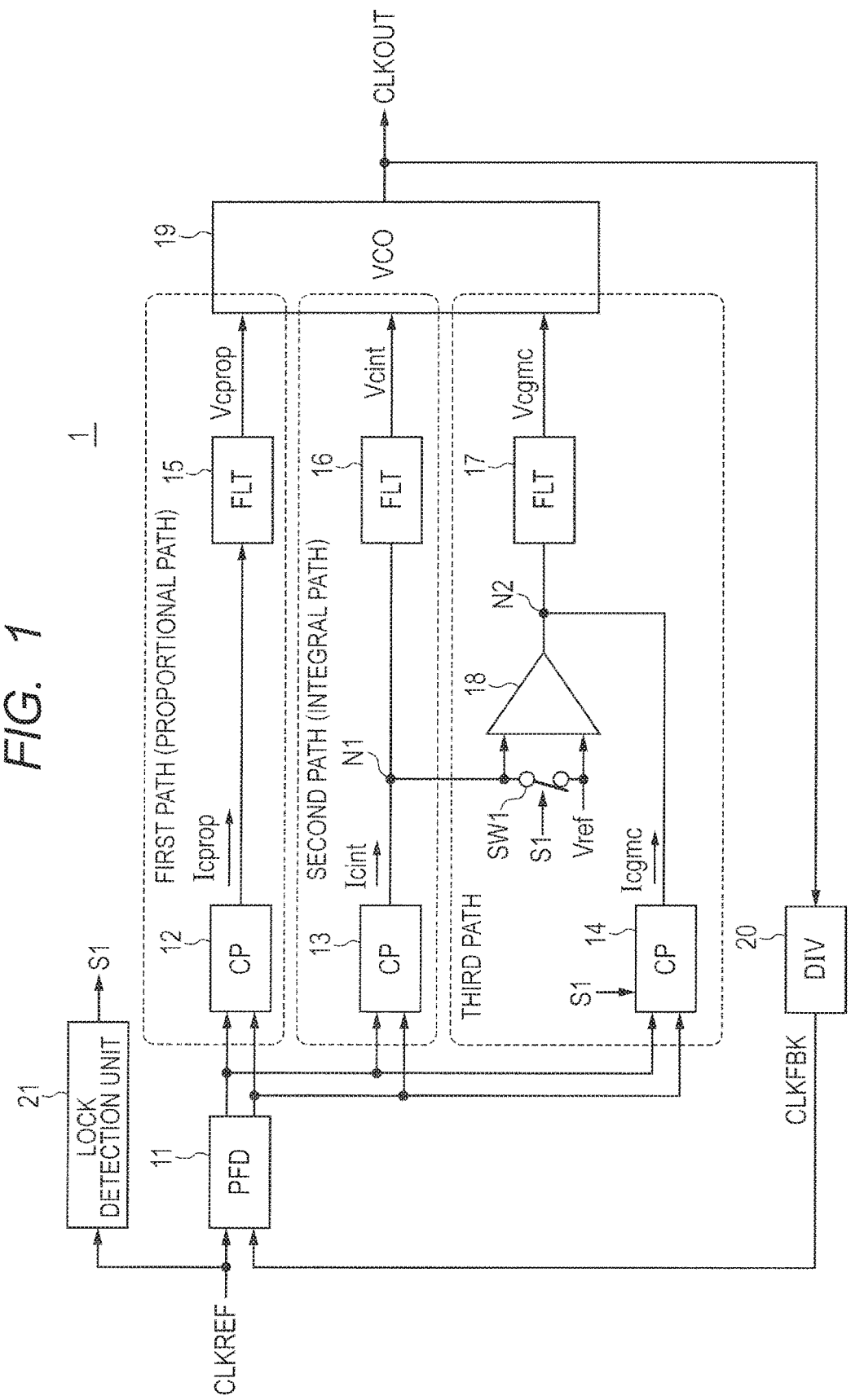
FIG. 1 is a diagram showing a configuration example of a PLL circuit according to a first embodiment.

For clarity of explanation, the following description and drawings are appropriately omitted and simplified. The components shown in the drawings as functional blocks that perform various processing can be composed of a CPU (Central Processing Unit), a memory, and other circuits as hardware and are realized by a program and the like loaded in a memory as software. Therefore, it should be understood by those skilled in the art that the functional blocks can be realized in various forms by only hardware, only software, or a combination of these, and the functional blocks are not limited to any one of hardware, software, and a combination of these. In the drawings, the same components are denoted by the same reference symbols and redundant description is omitted as appropriate.

The program described above can be stored in various types of non-transitory computer readable media and supplied to a computer. The non-transitory computer readable media include various types of substantial recording media. Examples of the non-transitory computer readable media include a magnetic recording medium (for example, flexible disk, magnetic tape, and hard disk drive), a magneto-optical recording medium (for example, magneto-optical disk), a CD-ROM (Read Only Memory), a CD-R, a CD-R/W, and a semiconductor memory (for example, mask ROM, PROM (Programmable ROM), EPROM (Erasable PROM), flash ROM, and RAM (Random Access Memory)). The program may be supplied to a computer by various types of transitory computer readable media. Examples of the transitory computer readable media include an electrical signal, an optical signal, and an electromagnetic wave. The transitory computer readable media can supply the program to a computer through a wired communication path such as an electrical wire and an optical fiber or a wireless communication path.

<Study in Advance by Inventors>

Prior to detailed description of a PLL circuit according to a first embodiment, contents studied in advance by the inventors will be described.

(Configuration of PLL Circuit 5 in Conceptual Stage)

Figure 27:
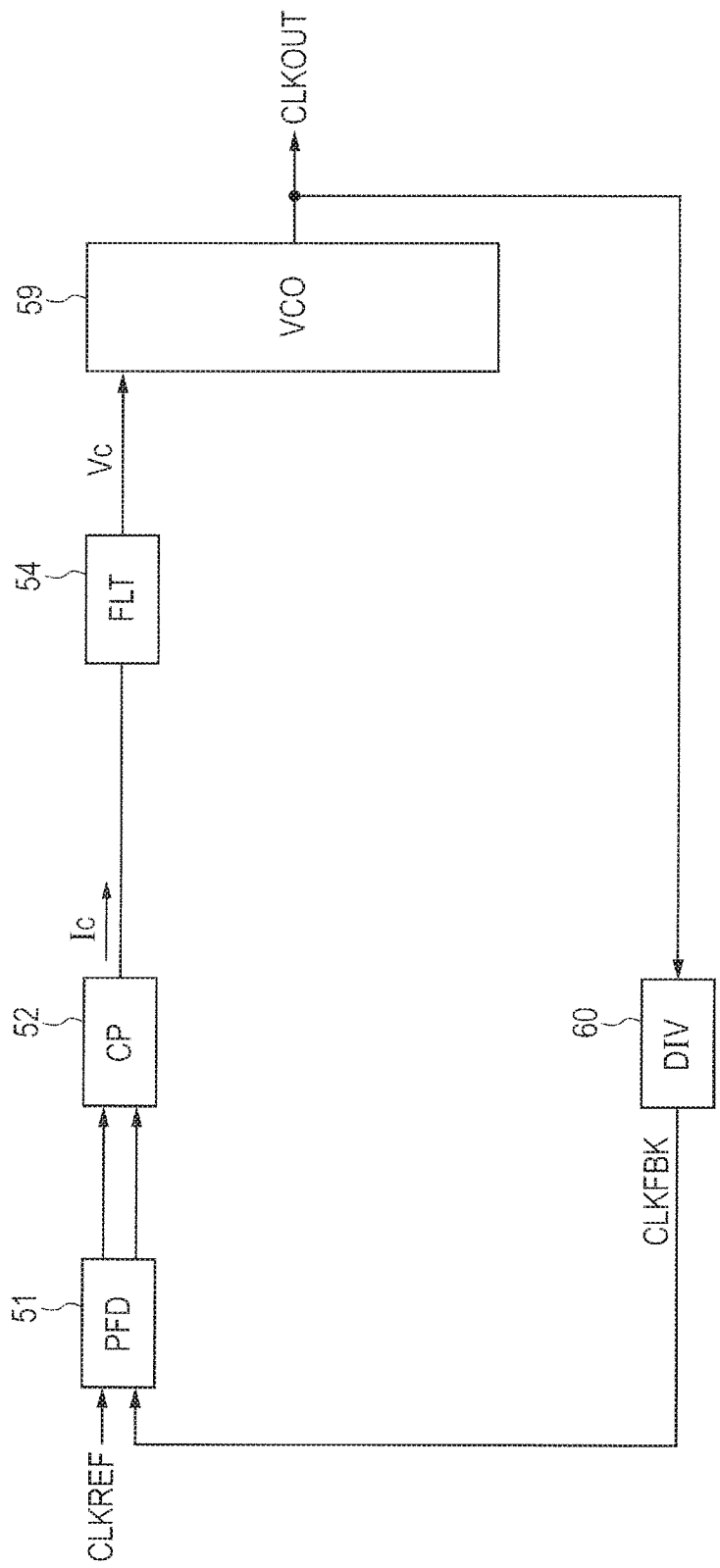
FIG. 27 is a diagram showing a first configuration of a PLL circuit according to a concept before reaching the embodiments.

FIG. 27 is a diagram showing a configuration of a PLL circuit 5 according to a concept before reaching the embodiments.

As shown in FIG. 27, the PLL circuit 5 is a PLL circuit having a single path configuration and includes a phase comparator (PFD) 51, a charge pump (CP) 52, a filter (FLT) 54, a voltage controlled oscillator (VCO) 59, and a frequency divider (DIV) 60.

The phase comparator 51 compares phases of a reference clock signal CLKREF and a feedback clock signal CLKFBK and outputs comparison results UP and DN. Both the comparison results UP and DN are pulse signals.

Figure 28:
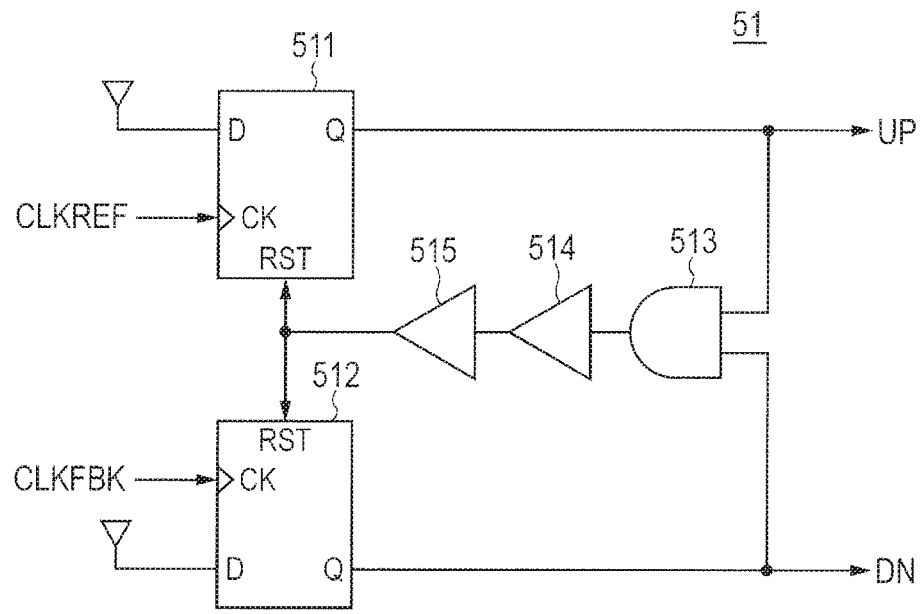
FIG. 28 is a diagram showing a configuration of a phase comparator provided in the PLL circuit shown in FIG. 27.

FIG. 28 is a diagram showing a configuration example of the phase comparator 51.

As shown in FIG. 28, the phase comparator 51 has flip-flops 511 and 512, a logical AND circuit (hereinafter referred to as an AND circuit) 513, and invertors 514 and 515.

In the flip-flop 511, a H level fixed signal is inputted into a data input terminal D, the reference clock signal CLKREF is inputted into a clock input terminal CK, an output of the AND circuit 513 is inputted into a reset input terminal RST through the invertors 514 and 515, and the comparison result UP is outputted from a data output terminal Q.

In the flip-flop 512, a H level fixed signal is inputted into a data input terminal D, the feedback clock signal CLKFBK is inputted into a clock input terminal CK, an output of the AND circuit 513 is inputted into a reset input terminal RST through the invertors 514 and 515, and the comparison result DN is outputted from a data output terminal Q.

The AND circuit 513 generates a logical AND of the comparison results UP and DN and outputs the logical AND to the flip-flops 511 and 512 through the invertors 514 and 515.

The flip-flop 511 causes the comparison result UP to rise in synchronization with rise of the reference clock signal CLKREF. The flip-flop 512 causes the comparison result DN to rise in synchronization with rise of the feedback clock signal CLKFBK. When both the comparison results UP and DN rise, the AND circuit 513 causes its output to rise. Thereby, the flip-flops 511 and 512 are initialized, so that both the comparison results UP and DN fall.

For example, when there is no phase difference between the reference clock signal CLKREF and the feedback clock signal CLKFBK, the phase comparator 51 outputs the comparison results UP and DN having the same pulse width. On the other hand, when there is a phase difference between the reference clock signal CLKREF and the feedback clock signal CLKFBK, the phase comparator 51 outputs the comparison results UP and DN whose pulse widths are different from each other. More specifically, when the phase of the feedback clock signal CLKFBK is delayed from the phase of the reference clock signal CLKREF, the pulse width of the comparison result UP is made longer than the pulse width of the comparison result DN, and when the phase of the feedback clock signal CLKFBK is advanced beyond the phase of the reference clock signal CLKREF, the pulse width of the comparison result DN is made longer than the pulse width of the comparison result UP.

The charge pump 52 generates a current Ic corresponding to the comparison results UP and DN of the phase comparator 51.

Figure 29:
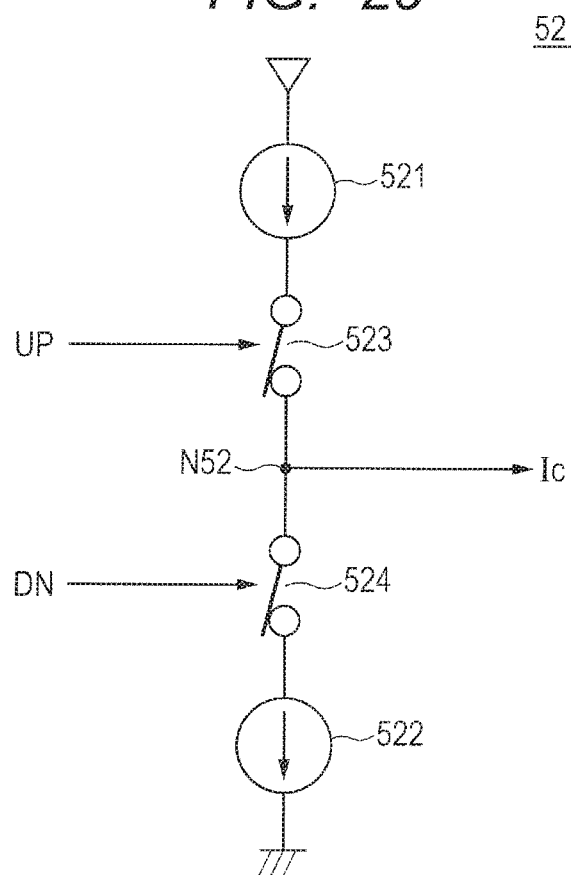
FIG. 29 is a diagram showing a configuration of a charge pump provided in the PLL circuit shown in FIG. 27.

FIG. 29 is a diagram showing a configuration example of the charge pump 52.

As shown in FIG. 29, the charge pump 52 has constant current sources 521 and 522 and switch elements (current supply control switches) 523 and 524. Each of the switch elements 523 and 524 is, for example, an N-channel MOS transistor.

The constant current source 521 and the switch element 523 are provided between a power supply voltage terminal (hereinafter referred to as a power supply voltage terminal VDD) from which a power supply voltage VDD is supplied and an output terminal (node N52) of the charge pump 52. The switch element 523 is controlled to be turned on or off based on the comparison result UP. The constant current source 522 and the switch element 524 are provided between a ground voltage terminal (hereinafter referred to as a ground voltage terminal GND) from which a ground voltage GND is supplied and the node N52. The switch element 524 is controlled to be turned on or off based on the comparison result DN.

For example, when the pulse widths of the comparison results UP and DN are the same, the switch elements 523 and 524 are turned on for the same period, so that the current Ic generated by the charge pump 52 is zero. On the other hand, when the pulse width of the comparison result UP is longer than the pulse width of the comparison result DN, the charge pump 52 generates a positive polarity current Ic for a period corresponding to a difference between the pulse widths (that is, a phase difference). Thereby, electric charges are accumulated in the filter 54. When the pulse width of the comparison result DN is longer than the pulse width of the comparison result UP, the charge pump 52 generates a negative polarity current Ic for a period corresponding to a difference between the pulse widths (that is, a phase difference). Thereby, the electric charges accumulated in the filter 54 are extracted.

The filter 54 is a so-called secondary lag lead filter. The filter 54 generates a control voltage Vc by removing a high-frequency component of a voltage generated based on the output current Ic of the charge pump 52.

Figure 30:
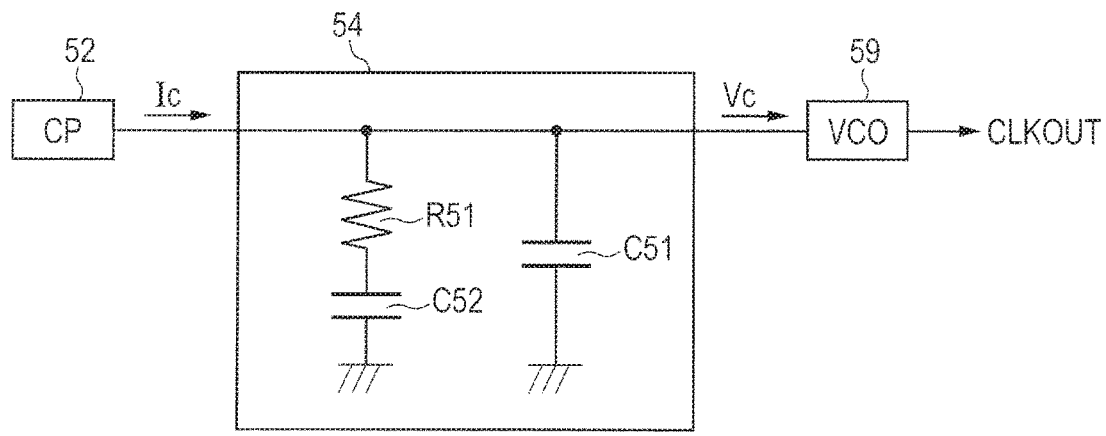
FIG. 30 is a diagram showing a configuration of a filter provided in the PLL circuit shown in FIG. 27.

FIG. 30 is a diagram showing a configuration example of the filter 54.

As shown in FIG. 30, the filter 54 has a resistive element R51 and capacitative elements C51 and C52. The capacitative element C51 is provided between the ground voltage terminal GND and the output terminal of the charge pump 52. The capacitative element C52 and the resistive element R51 are serially provided between the ground voltage terminal GND and the output terminal of the charge pump 52.

The electric charges of the current Ic generated by the charge pump 52 are accumulated in the capacitative element C52 and the electric charges of the current Ic are extracted from the capacitative element C52. Then, the control voltage Vc corresponding to the electric charges accumulated in the capacitative element C52 is generated. The resistive element R51 is provided to ensure stability of a feedback loop and forms a zero point. The capacitative element C51 is provided to suppress ripple voltage caused by the current Ic. By suppressing the ripple voltage, increase in jitter of an output clock signal CLKOUT described later is suppressed.

A voltage controlled oscillator 59 outputs an oscillation signal with a phase and a frequency according to the control voltage Vc. For example, the voltage controlled oscillator 59 outputs the oscillation signal so that the higher the control voltage Vc, the higher the frequency of the oscillation signal, and the lower the control voltage Vc, the lower the frequency of the oscillation signal. The oscillation signal is outputted to the outside of the PLL circuit 5 as the output clock signal CLKOUT.

Figure 31:
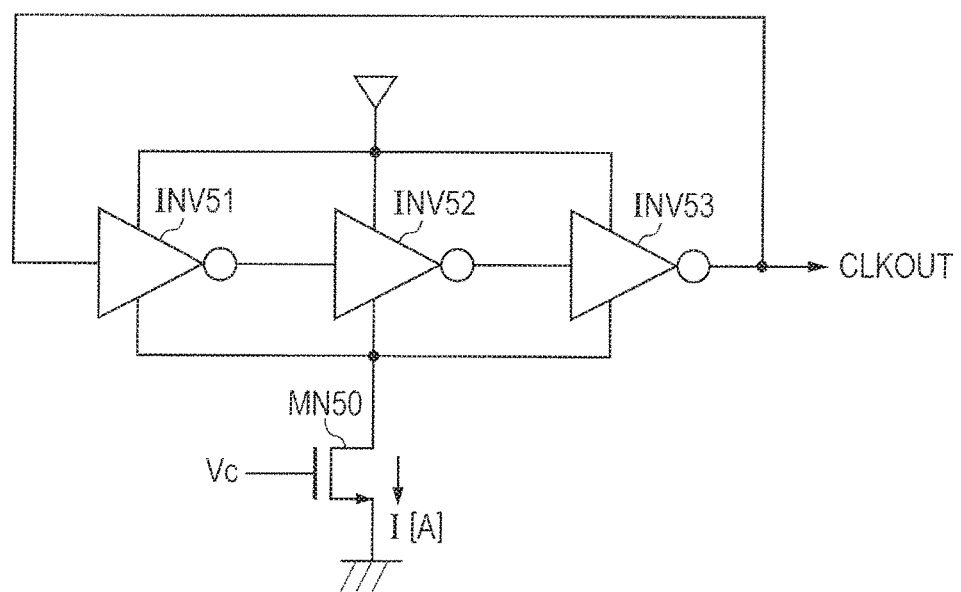
FIG. 31 is a diagram showing a configuration of a voltage controlled oscillator provided in the PLL circuit shown in FIG. 27.

FIG. 31 is a diagram showing a configuration example of the voltage controlled oscillator 59.

As shown in FIG. 31, the voltage controlled oscillator 59 has invertors INV51 to INV53 and a transistor MN50. The invertors INV51 to INV53 are provided in a loop shape and an output of the invertor INV53 is outputted as the oscillation signal of the voltage controlled oscillator 59. The transistor MN50 is provided between a low potential side power supply terminal of each of the invertors INV51 to INV53 and the ground voltage terminal GND, and an on-current of the transistor MN50 is controlled according to the control voltage Vc. In other words, a delay amount of the invertors INV51 to INV53 is controlled by the control voltage Vc.

The frequency divider 60 frequency-divides the oscillation signal outputted from the voltage controlled oscillator 59 and outputs the frequency-divided oscillation signal as the feedback clock signal CLKFBK.

Here, in the PLL circuit 5, a capacitance value of the capacitive element C52 provided in the filter 54 is preferred to be as large as possible in order to ensure the stability of the feedback loop. However, when the capacitance value of the capacitive element C52 is increased, a circuit scale of the PLL circuit 5 increases.

To solve the above problem, the inventors have next studied a PLL circuit 5a.

(Configuration of PLL Circuit 5a in Conceptual Stage)

Figure 32:
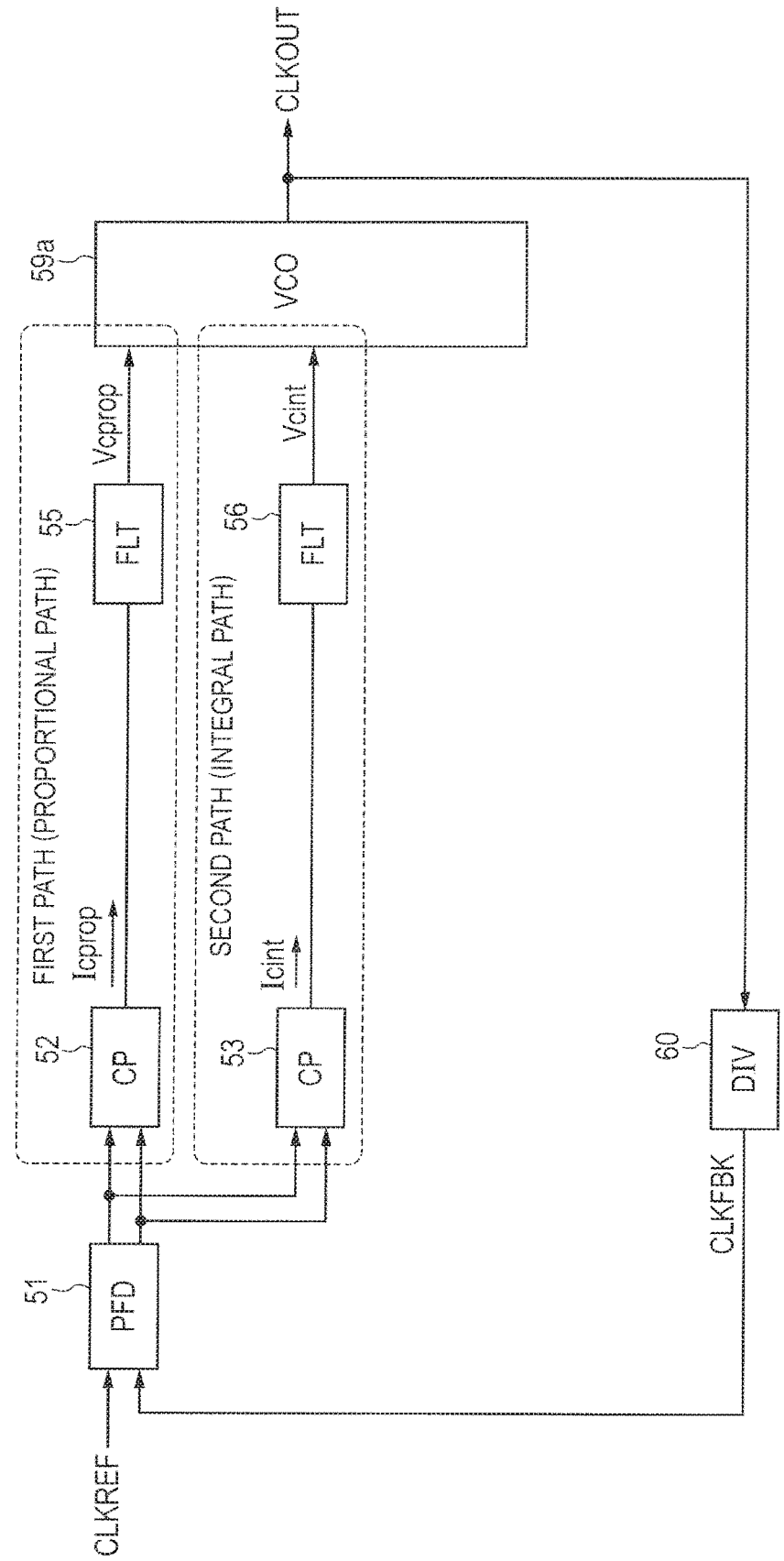
FIG. 32 is a diagram showing a second configuration of the PLL circuit according to the concept before reaching the embodiments.

FIG. 32 is a diagram showing a configuration of the PLL circuit 5a according to a concept before reaching the embodiments.

As shown in FIG. 32, the PLL circuit 5a is a PLL circuit having a dual path configuration and includes a phase comparator 51, charge pumps 52 and 53, filters 55 and 56, a voltage controlled oscillator 59a, and a frequency divider 60.

In the PLL circuit 5a, the filter 54 provided in the PLL circuit 5 is divided into two filters 55 and 56.

Figure 33:
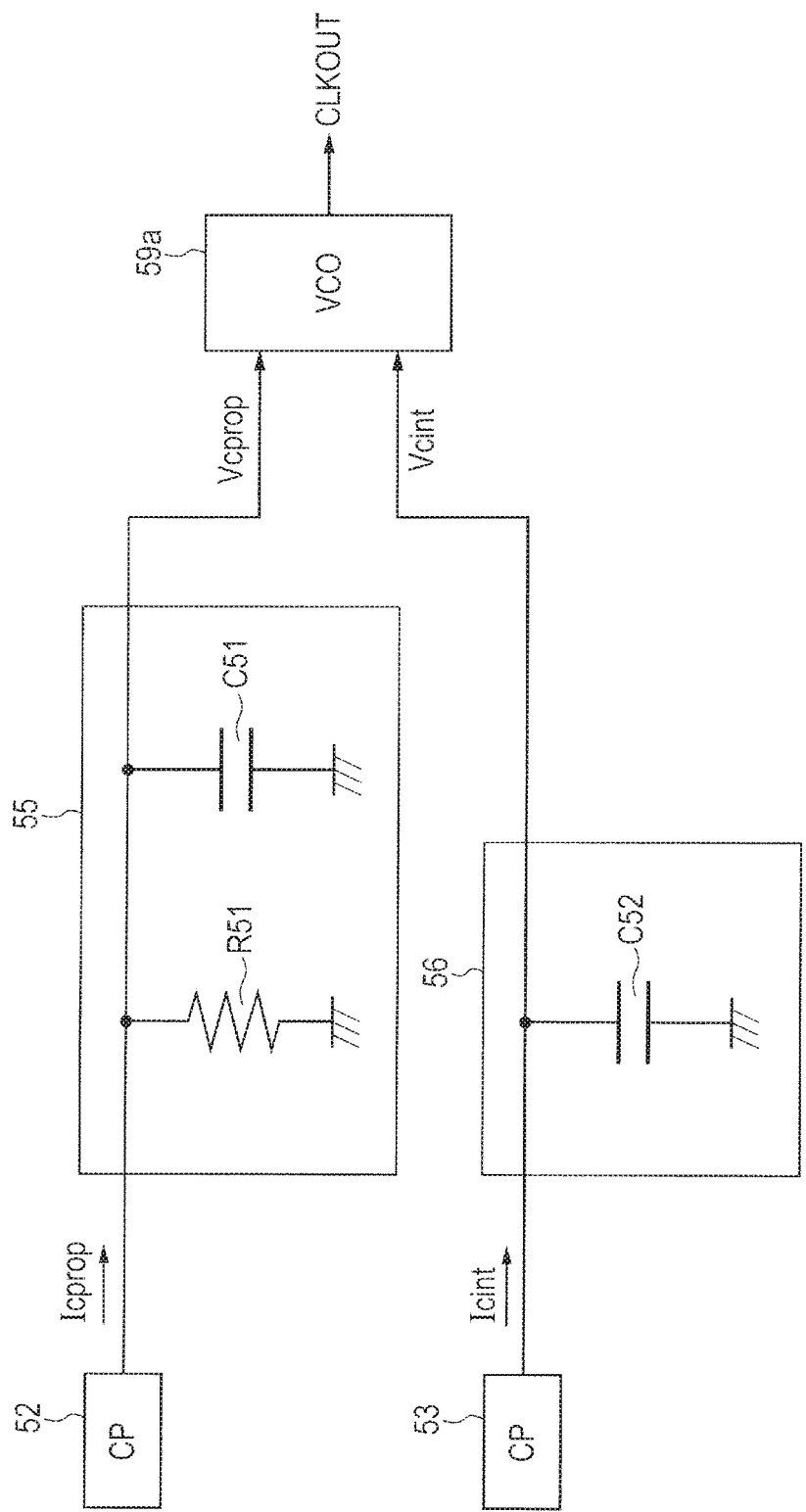
FIG. 33 is a diagram showing a configuration of first and second filters provided in the PLL circuit shown in FIG. 32.

FIG. 33 is a diagram showing a configuration example of the filters 55 and 56. As shown in FIG. 33, the filter 55 has the resistive element R51 and the capacitive element C51 of the components of the filter 54. The filter 56 has the capacitive element C51 of the components of the filter 54.

In a first path, the charge pump 52 generates a current Icprop corresponding to the comparison results UP and DN of the phase comparator 51. The filter 55 generates a control voltage Vcprop obtained by removing a ripple noise from a voltage generated based on the current Icprop.

In a second path, the charge pump 53 has the same circuit configuration as that of the charge pump 52 and generates a current Icint corresponding to the comparison results UP and DN of the phase comparator 51. The filter 56 generates the control voltage Vcint by integrating the current Icint.

The voltage controlled oscillator 59a mainly outputs an oscillation signal with a phase (and a frequency) according to the control voltage Vcprop and a frequency according to the control voltage Vcint. For example, the voltage controlled oscillator 59a outputs the oscillation signal so that the higher the control voltages Vcprop and Vcint, the higher the frequency of the oscillation signal, and the lower the control voltages Vcprop and Vcint, the lower the frequency of the oscillation signal. The oscillation signal is outputted to the outside of the PLL circuit 5a as the output clock signal CLKOUT.

Figure 34:
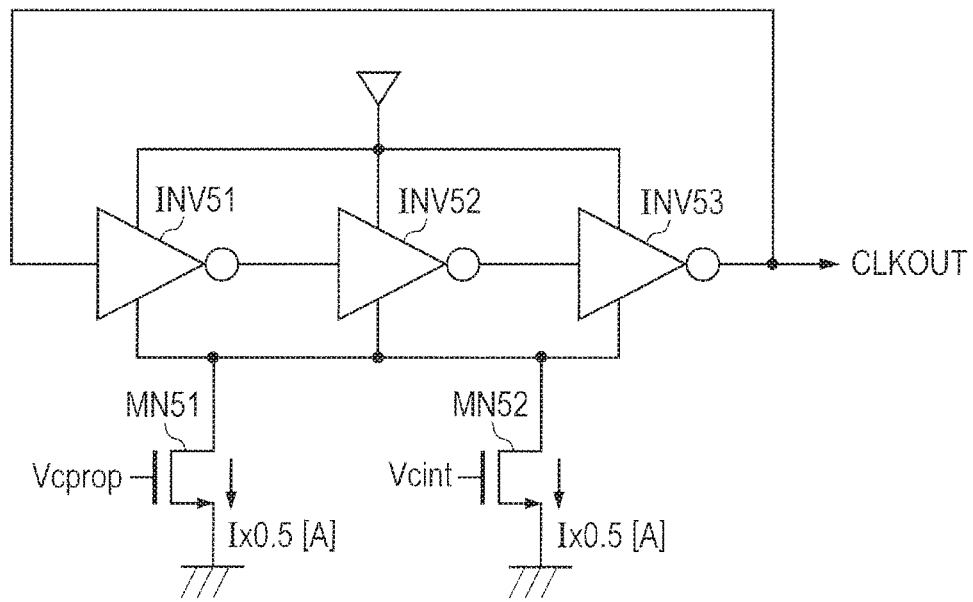
FIG. 34 is a diagram showing a configuration of a voltage controlled oscillator provided in the PLL circuit shown in FIG. 32.

FIG. 34 is a diagram showing a configuration example of the voltage controlled oscillator 59a.

As shown in FIG. 34, the voltage controlled oscillator 59a has transistors MN51 and MN52 instead of the transistor MN50 as compared with the voltage controlled oscillator 59. The transistor MN51 is provided between a low potential side power supply terminal of each of the inverters INV51 to INV53 and the ground voltage terminal GND, and an on-current of the transistor MN51 is controlled according to the control voltage Vcprop. The transistor MN52 is provided in parallel with the transistor MN51, and an on-current of the transistor MN52 is controlled according to the control voltage Vcint. In other words, a delay amount of the inverters INV51 to INV53 is controlled by the control voltages Vcprop and Vcint.

It is preferable that the transistors MN51 and MN 52 are configured so that the sum of currents flowing through each of the transistors MN51 and MN 52 is the same as the current flowing through the transistor MN50. Therefore, for example, it is configured so that the size of each of the transistors MN51 and MN52 is half the size of the transistor MN50.

The other components of the PLL circuit 5a are the same as those of the PLL circuit 5, so the descriptions thereof are omitted. Here, in a path (first path) from the phase comparator 51 to the voltage controlled oscillator 59a through the charge pump 52 and the filter 55, the filter 55 does not have a charge holding function and a phase difference is fine-tuned every time the phase comparator 51 performs comparison. Hereinafter, a path where phase control is performed is also referred to as a proportional path. On the other hand, in a path (second path) from the phase comparator 51 to the voltage controlled oscillator 59a through the charge pump 53 and the filter 56, the filter 56 has a charge holding function and holds frequency information. Hereinafter, a path where frequency control is performed is also referred to as an integral path.

In this example, a current value of the current Icint outputted from the charge pump 53 is one tenth of a current value of the current Icprop outputted from the charge pump 52. A resistance value of the resistive element R51 provided in the filter 55 and a capacitance value of the capacitive element C51 provided in the filter 55 are the same as those in the PLL circuit 5. However, a capacitance value of the capacitive element C52 provided in the filter 56 is one tenth of that of the capacitive element C52 in the PLL circuit 5. Therefore, a composite voltage of the control voltages Vcprop and Vcint in the PLL circuit 5a is generated by the same transfer function as that of the control voltage Vc in the PLL circuit 5.

In this way, the size of the capacitative element C52 in the PLL circuit 5a can be smaller than that in the PLL circuit 5, so that it is possible to suppress increase in a circuit scale.

However, in the PLL circuit 5a, noise occurs in the control voltage Vcprop due to thermal noise of the resistive element R51 provided in the filter 55, and input jitter of the reference clock signal repropagates to the voltage controlled oscillator 59a, so there is a problem that jitter of the output clock signal CLKOUT increases.

To solve this problem, the inventors have next studied a PLL circuit 5b.

(Configuration of PLL Circuit 5b in Conceptual Stage)

Figure 35:
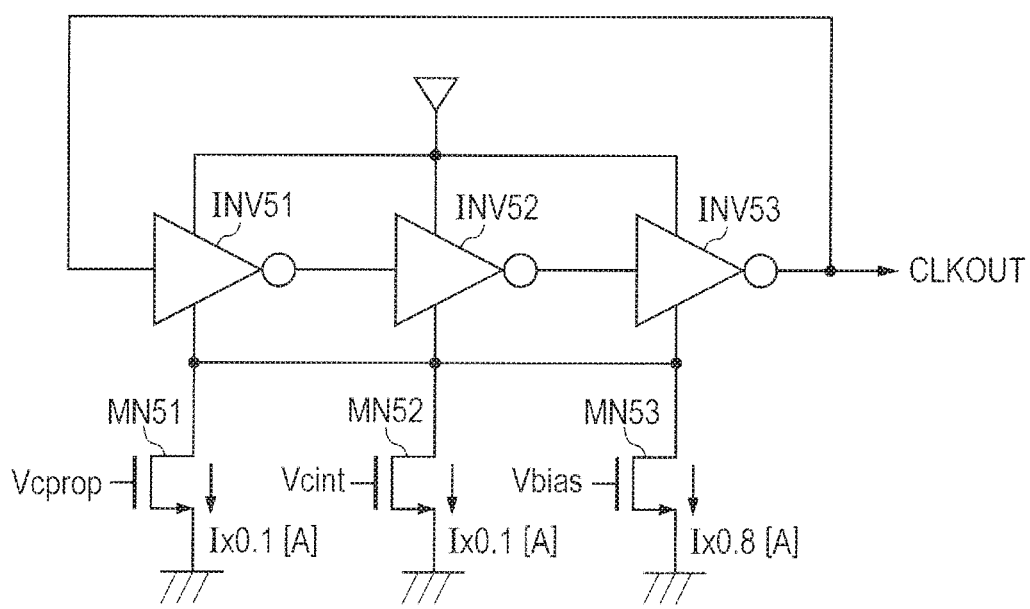
FIG. 35 is a diagram showing a modified example of the voltage controlled oscillator shown in FIG. 34.

FIG. 35 is a diagram showing a configuration example of a voltage controlled oscillator 59b (corresponding to the voltage controlled oscillator 59a) provided in the PLL circuit 5b.

As shown in FIG. 35, the voltage controlled oscillator 59b further includes a transistor MN53 in addition to the transistors MN51 and MN52 as compared with the voltage controlled oscillator 59a. The transistor MN53 is provided in parallel with the transistors MN51 and MN52, and a bias voltage Vbias is supplied to the gate of the transistor MN53.

The transistors MN51 to MN 53 are configured so that the sum of currents flowing through each of the transistors MN51 to MN 53 is the same as the current flowing through the transistor MN50. For example, it is configured so that the size of each of the transistors MN51 and MN52 is one tenth of the size of the transistor MN50 and the size of the transistor MN53 is eight tenths of the size of the transistor MN50. Specifically, the transistor MN53 is configured by coupling eight transistors, each of which has the same size as that of the transistor MN51 or MN52, in parallel.

The other components of the PLL circuit 5b are the same as those of the PLL circuit 5a, so the descriptions thereof are omitted.

The PLL circuit 5b can suppress gain of noise by reducing the size of each of the transistors MN51 and MN52 to be smaller than that of the PLL circuit 5a in this way and reducing gain of current conversion of each of the control voltages Vcprop and Vcint to be smaller than that of the PLL circuit 5a. As a result, the jitter of the output clock signal CLKOUT is suppressed.

However, in the PLL circuit 5b, a range in which current can be varied by change of the control voltages Vcprop and Vcint is limited, so that there is a problem that a range of an oscillation frequency is also limited. Further, there is a problem that an offset current generated by the bias voltage Vbias is easily varied by variations of process, power supply voltage, and temperature in general.

To solve this problem, the inventors have next studied a PLL circuit 5c.

(Configuration of PLL Circuit 5c in Conceptual Stage)

Figure 36:
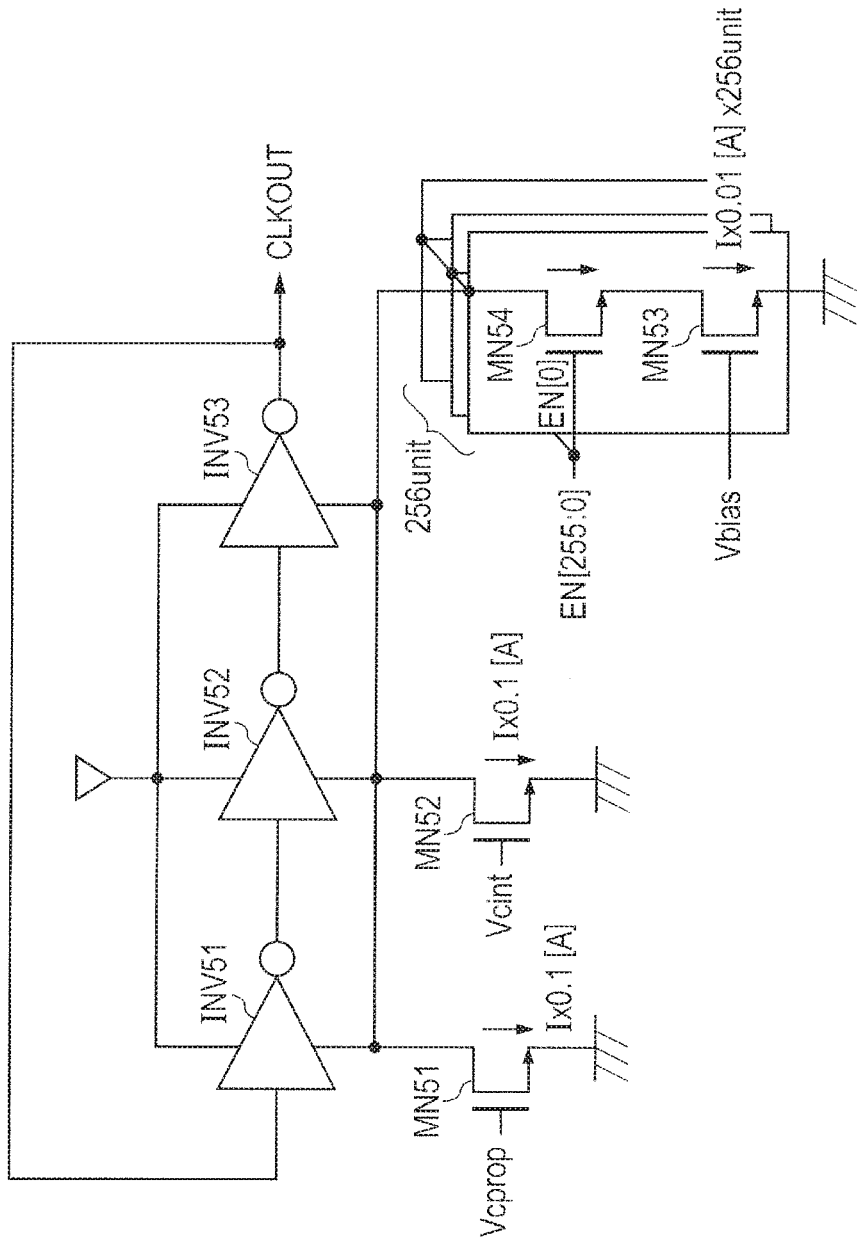
FIG. 36 is a diagram showing a modified example of the voltage controlled oscillator shown in FIG. 35.

FIG. 36 is a diagram showing a configuration example of a voltage controlled oscillator 59c (corresponding to the voltage controlled oscillator 59b) provided in the PLL circuit 5c.

As shown in FIG. 36, the voltage controlled oscillator 59c further includes a transistor MN54 as compared with the voltage controlled oscillator 59b. The transistor MN54 is provided in series to the transistor MN53, and an on-current of the transistor MN54 is controlled by an enable signal EN. The enable signal EN is, for example, a 256-bit digital signal. The transistor MN 54 is configured by coupling 256 transistors according to a bit width of the digital signal in parallel.

The other components of the PLL circuit 5c are the same as those of the PLL circuit 5b, so the descriptions thereof are omitted.

For example, when the PLL circuit 5c is activated, the PLL circuit 5c digitally calibrates an offset current of a voltage controlled oscillator 59d generated by variation of the bias voltage Vbias. Thereby, even when the range in which current can be varied by change of the control voltages Vcprop and Vcint is limited and even when the offset current is varied from a predetermined value by variations of process, power supply voltage, and temperature, it is possible to lock a phase at a target oscillation frequency.

However, in the PLL circuit 5c, there is a problem that when the bias voltage Vbias varies during a normal operation, the offset current cannot be calibrated in real time. If the offset current is calibrated in real time during a normal operation, a minimum unit of offset current variation amount increases due to effects of digital control, so that the oscillation frequency largely varies. As a result, the jitter of the output clock signal CLKOUT increases.

The transistor MN54 is used in a saturation region, so that limitation of the minimum unit of offset current variation amount is at least several pA. When the number of transistors included in the transistor MN54 is increased in order to enhance a resolution, a circuit scale and the number of signal lines increase.

To solve this problem, the inventors have next studied a PLL circuit 5d.

(Configuration of PLL Circuit 5d in Conceptual Stage)

Figure 37:
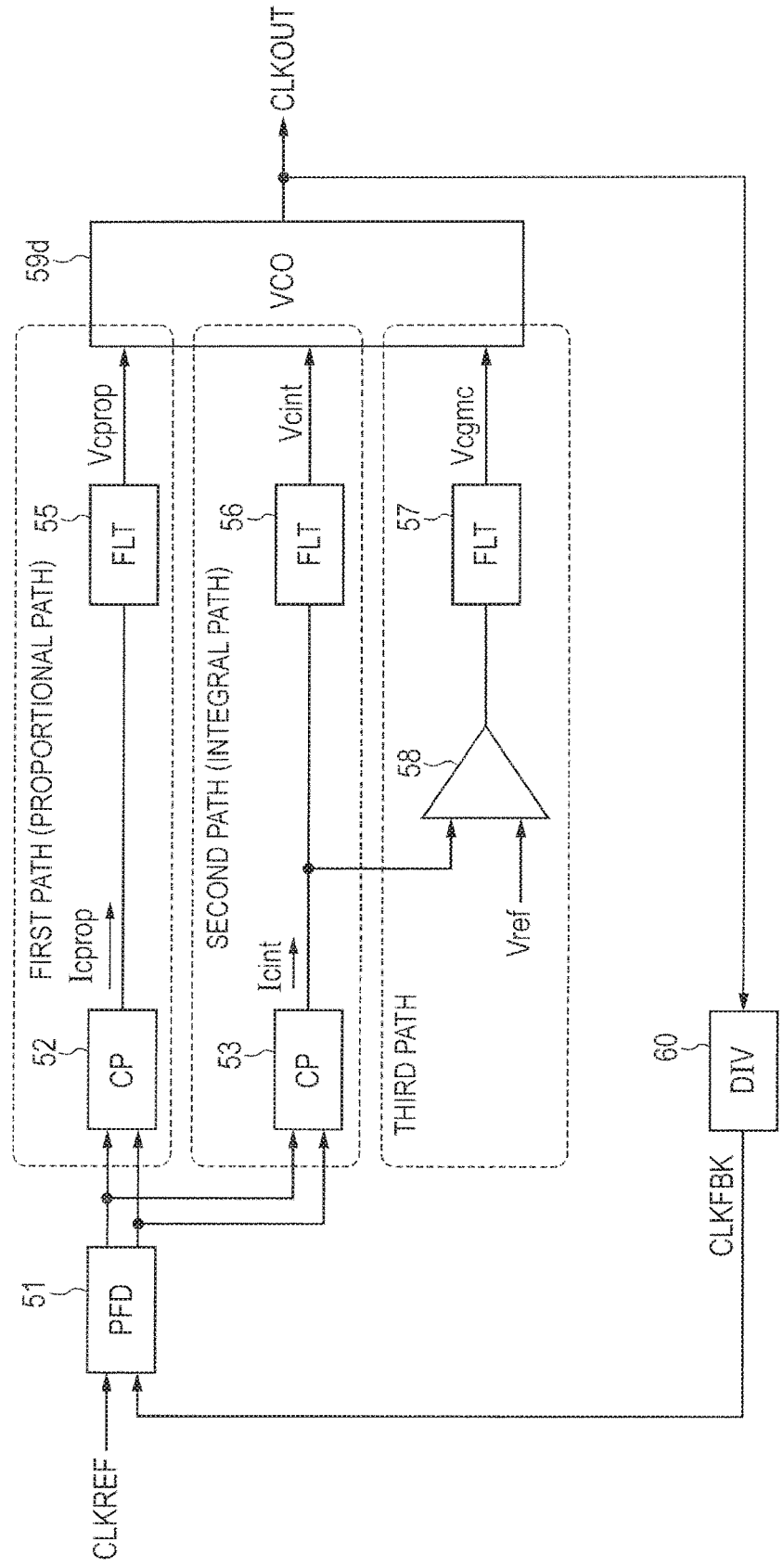
FIG. 37 is a diagram showing a third configuration of the PLL circuit according to the concept before reaching the embodiments.

FIG. 37 is a diagram showing a configuration of the PLL circuit 5d according to a concept before reaching the embodiments.

As shown in FIG. 37, the PLL circuit 5d is a PLL circuit having a triple path configuration. The PLL circuit 5d further includes a comparator 58 and a filter 57 as compared with the PLL circuit 5a and includes a voltage controlled oscillator 59d instead of the voltage controlled oscillator 59a.

In the third path, the comparator 58 compares the control voltage Vcint obtained by integrating an output current Icint of the charge pump 53 by the filter 56 with a reference voltage Vref and outputs a comparison result. In other words, the comparator 58 detects whether or not the control voltage Vcint is shifted from the reference voltage Vref. For example, when the control voltage Vcint is greater than the reference voltage Vref, the comparator 58 outputs a positive polarity current, when the control voltage Vcint is smaller than the reference voltage Vref, the comparator 58 outputs a negative polarity current, and when the control voltage Vcint indicates the reference voltage Vref, the comparator 58 outputs no current.

The filter 57 has, for example, the same circuit configuration as that of the filter 56 and generates a control voltage Vcgmc by integrating the comparison result (output current) of the comparator 58.

Figure 38:
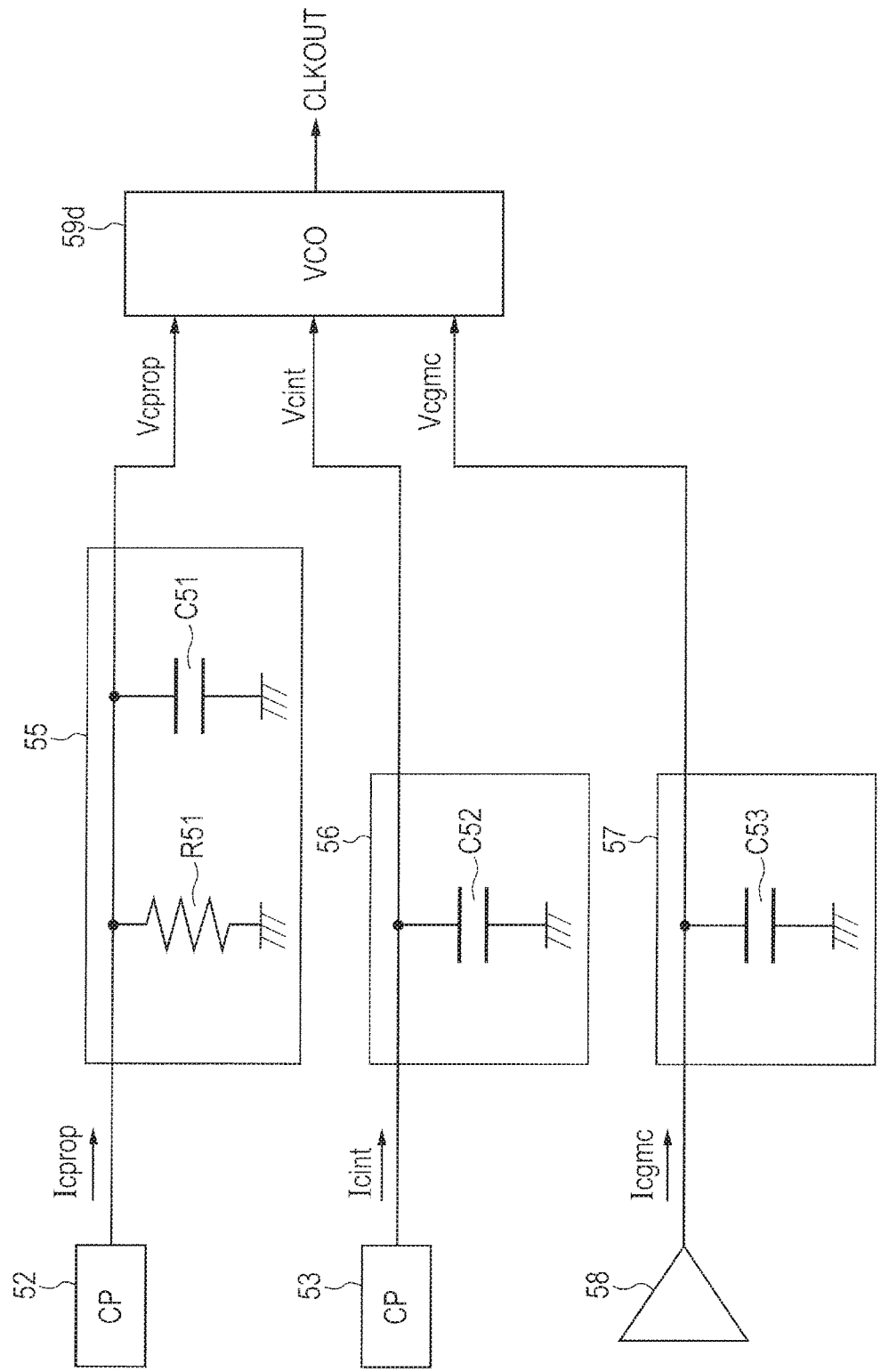
FIG. 38 is a diagram showing a configuration of first to third filters provided in the PLL circuit shown in FIG. 37.

FIG. 38 is a diagram showing a configuration example of the filters 55 to 57. As shown in FIG. 38, the filter 57 has one capacitative element C53 in the same manner as the filter 57.

The voltage controlled oscillator 59d mainly outputs an oscillation signal with a phase (and a frequency) according to the control voltage Vcprop and a frequency according to the control voltages Vcint and Vcgmc. For example, the voltage controlled oscillator 59d outputs the oscillation signal so that the higher the control voltages Vcprop, Vcint, and Vcgmc, the higher the frequency of the oscillation signal, and the lower the control voltages Vcprop, Vcint, and Vcgmc, the lower the frequency of the oscillation signal. The oscillation signal is outputted to the outside of the PLL circuit 5d as the output clock signal CLKOUT.

Figure 39:
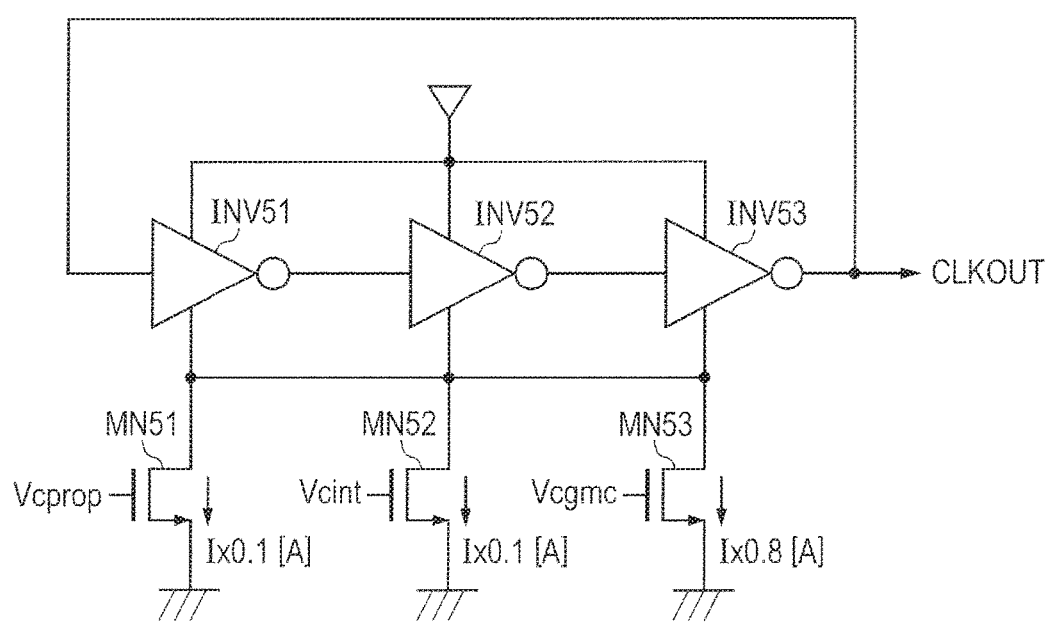
FIG. 39 is a diagram showing a configuration of a voltage controlled oscillator provided in the PLL circuit shown in FIG. 37.

FIG. 39 is a diagram showing a configuration example of the voltage controlled oscillator 59d.

As shown in FIG. 39, the voltage controlled oscillator 59d further includes a transistor MN53 in addition to the transistors MN51 and MN52 as compared with the voltage controlled oscillator 59a. The transistor MN53 is provided in parallel with the transistors MN51 and MN52, and an on-current of the transistor MN53 is controlled according to the control voltage Vcgmc. In other words, a delay amount of the invertors INV51 to INV53 is controlled by the control voltages Vcprop, Vcint, and Vcgmc.

The transistors MN51 to MN 53 are configured so that the sum of currents flowing through each of the transistors MN51 to MN 53 is the same as the current flowing through the transistor MN50. For example, it is configured so that the size of each of the transistors MN51 and MN52 is one tenth of the size of the transistor MN50 and the size of the transistor MN53 is eight tenths of the size of the transistor MN50. Specifically, the transistor MN53 is configured by coupling eight transistors, each of which has the same size as that of the transistor MN51 or MN52, in parallel.

The other components of the PLL circuit 5d are the same as those of the PLL circuit 5a, so the descriptions thereof are omitted.

Figure 40:
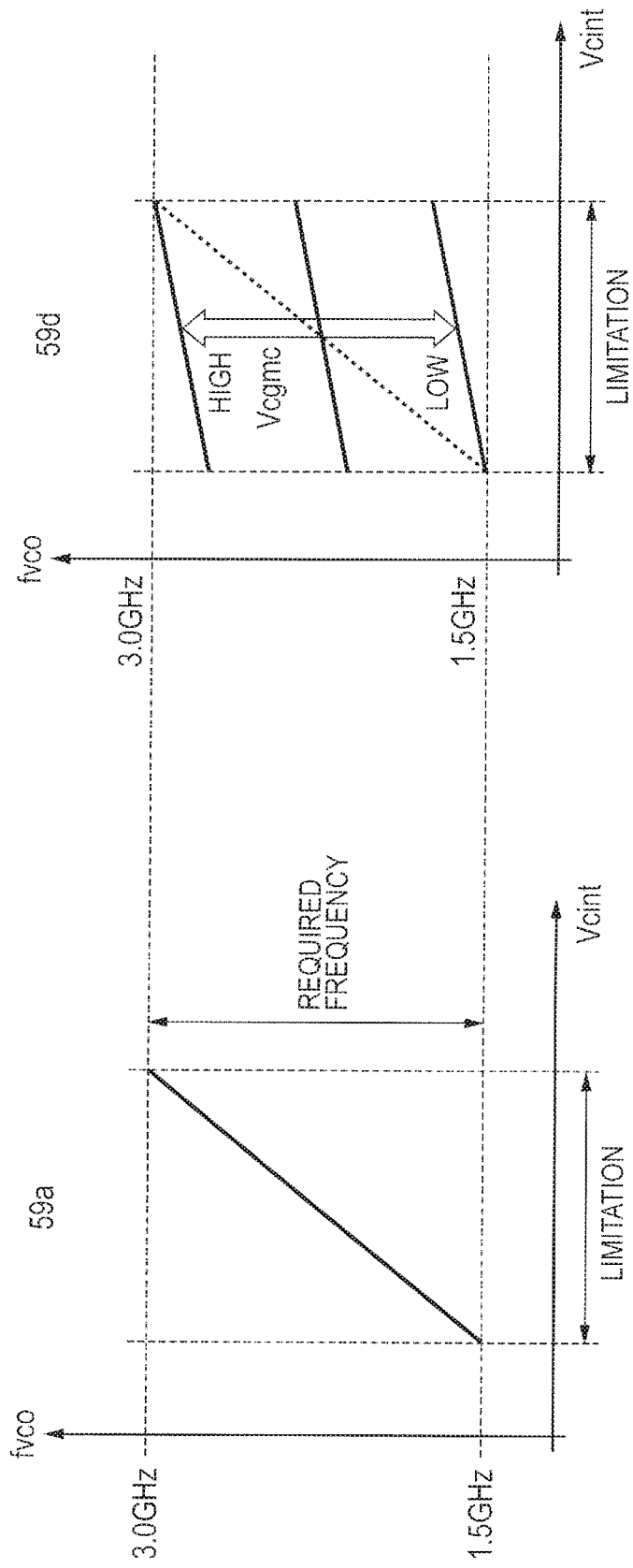
FIG. 40 is a diagram showing a relationship between control voltages Vcint and Vcgmc and an oscillation frequency fvco in the voltage controlled oscillator shown in FIG. 39.

FIG. 40 is a diagram showing a relationship between the control voltages Vcint and Vcgmc and an oscillation frequency fvco in the voltage controlled oscillator 59d. FIG. 40 also shows a relationship between the control voltage Vcint and the oscillation frequency fvco in the voltage controlled oscillator 59a for comparison.

As shown in FIG. 40, in the voltage controlled oscillator 59a provided in the PLL circuit 5a, the oscillation frequency fvco varies according to variation of the control voltage Vcint. On the other hand, in the voltage controlled oscillator 59d provided in the PLL circuit 5d, not only the oscillation frequency fvco varies according to variation of the control voltage Vcint, but also an offset component of the oscillation frequency fvco varies according to variation of the control voltage Vcgmc. For example, when the control voltage Vcint is higher than or equal to the reference voltage Vref, the control voltage Vcgmc rises, so that the offset component of the oscillation frequency fvco of the voltage controlled oscillator 59d gradually rises toward a target frequency. On the other hand, when the control voltage Vcint is lower than the reference voltage Vref, the control voltage Vcgmc falls, so that the offset component of the oscillation frequency fvco of the voltage controlled oscillator 59d gradually falls toward the target frequency.

In this way, the PLL circuit 5d calibrates the offset component of the oscillation frequency of the voltage controlled oscillator 59d (the offset current flowing through the voltage controlled oscillator 59d) in an analog manner by using the control voltage Vcgmc generated in the third path. Thereby, the PLL circuit 5d can calibrate the offset current in real time not only during start-up but also during a normal operation.

Here, a response speed of background control by the control voltage Vcgmc is required to be set to sufficiently slower than a response speed of loop control by the control voltages Vcprop and Vcint in order to ensure stability of the PLL circuit 5d. For example, the response speed of background control by the control voltage Vcgmc is set to slow down to about one tenth of the response speed of loop control by the control voltage Vcint.

Figure 41:
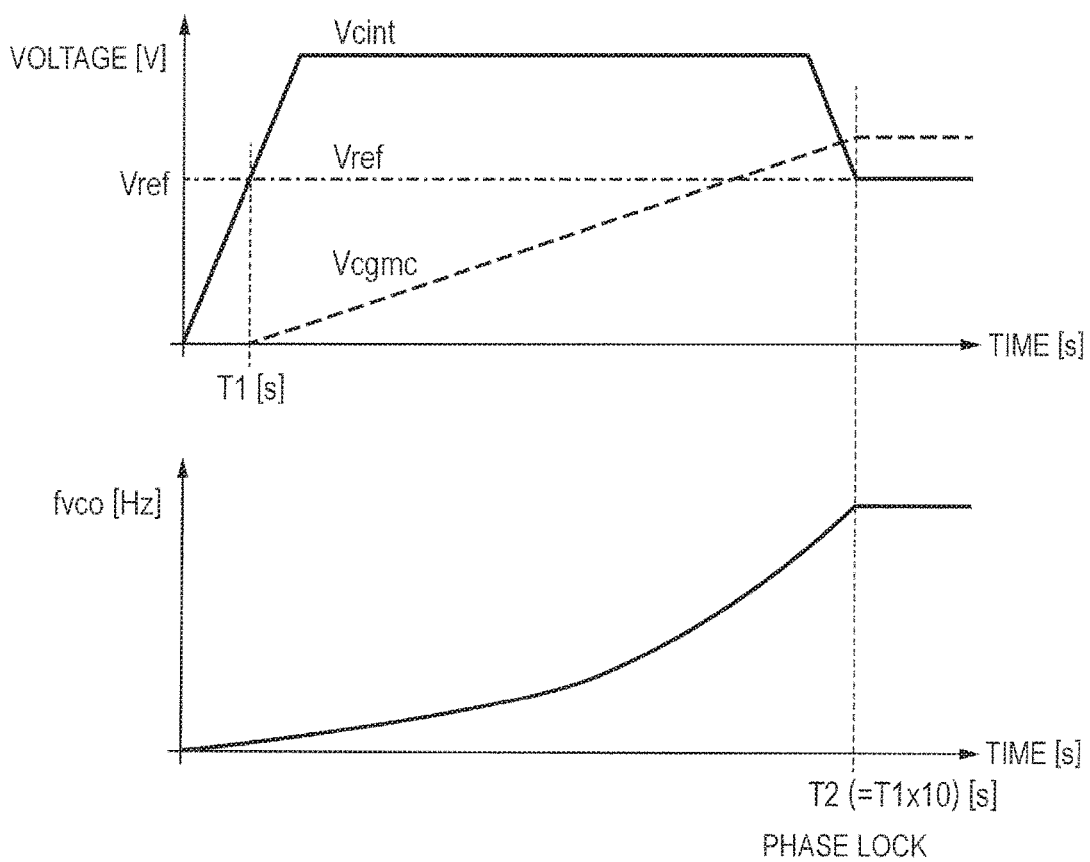
FIG. 41 is a timing chart showing an operation of the PLL circuit shown in FIG. 37.

FIG. 41 is a timing chart showing an operation of the PLL circuit 5d.

As shown in FIG. 41, in a configuration of the PLL circuit 5a where the control voltage Vcgmc is not used, time from when the PLL circuit 5a is activated to when phase is locked is, for example, T1 seconds. On the other hand, in the PLL circuit 5d, time from when the PLL circuit 5d is activated to when the control voltage Vcgmc is stabilized at a desired voltage level (that is, the background control is completed) and the phase is locked is, for example, T2 seconds which is ten times the T1 seconds. That is to say, in the PLL circuit 5d, there is a problem that the phase cannot be locked quickly after being activated.

Therefore, a PLL circuit according to a first embodiment which can quickly lock the phase, a semiconductor device including the PLL circuit, and a control method of the PLL circuit are found out.

First Embodiment

FIG. 1 is a block diagram showing a PLL circuit 1 according to the first embodiment. The PLL circuit 1 according to the present embodiment is a PLL circuit having a triple path configuration. When being activated, the PLL circuit 1 quickly locks the phase without performing control of an offset component of the oscillation frequency of low response speed, and after locking the phase, the PLL circuit 1 performs the control of the offset component of the oscillation frequency of low response speed. Thereby, the PLL circuit 1 according to the first embodiment can quickly lock the phase. Hereinafter, the PLL circuit 1 will be specifically described.

As shown in FIG. 1, the PLL circuit 1 is a PLL circuit having a triple path configuration and includes a phase comparator (PFD) 11, charge pumps (CP) 12 to 14, filters (FLT) 15 to 17, a comparator 18, a switch element SW1, a voltage controlled oscillator 19, a frequency divider 20, and a lock detection unit 21.

The phase comparator 11 compares phases of the reference clock signal CLKREF and the feedback clock signal CLKFBK and outputs comparison results UP and DN. Both the comparison results UP and DN are pulse signals.

Figure 2:
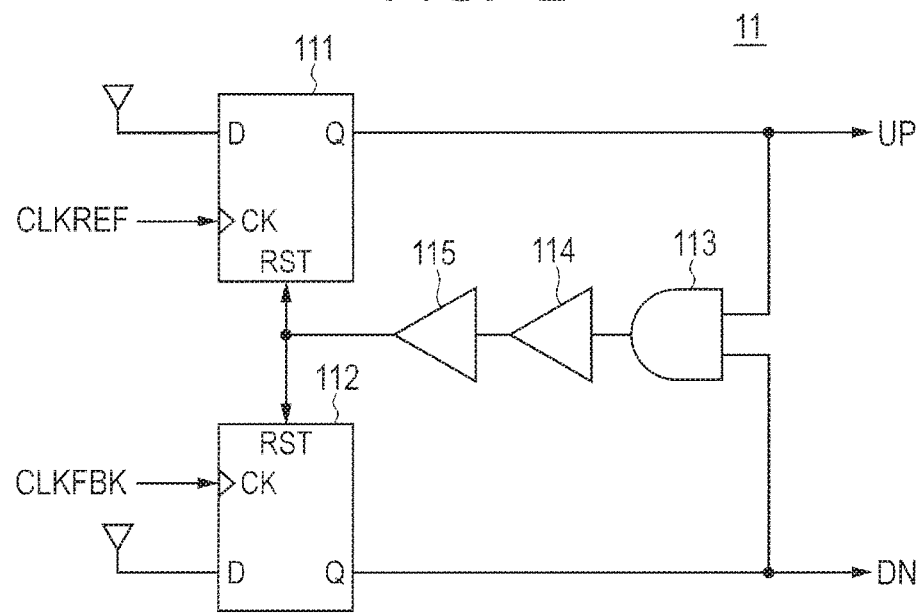
FIG. 2 is a diagram showing a configuration example of a phase comparator provided in the PLL circuit shown in FIG. 1.

FIG. 2 is a diagram showing a configuration example of the phase comparator 11.

As shown in FIG. 2, the phase comparator 11 has flip-flops 111 and 112, a logical AND circuit (hereinafter referred to as an AND circuit) 113, and inverters 114 and 115.

In the flip-flop 111, a H level fixed signal is inputted into a data input terminal D, the reference clock signal CLKREF is inputted into a clock input terminal CK, an output of the AND circuit 113 is inputted into a reset input terminal RST through the invertors 114 and 115, and the comparison result UP is outputted from a data output terminal Q.

In the flip-flop 112, a H level fixed signal is inputted into a data input terminal D, the feedback clock signal CLKFBK is inputted into a clock input terminal CK, an output of the AND circuit 113 is inputted into a reset input terminal RST through the invertors 114 and 115, and the comparison result DN is outputted from a data output terminal Q.

The AND circuit 113 generates a logical AND of the comparison results UP and DN and outputs the logical AND to the flip-flops 111 and 112 through the invertors 114 and 115.

The flip-flop 111 causes the comparison result UP to rise in synchronization with rise of the reference clock signal CLKREF. The flip-flop 112 causes the comparison result DN to rise in synchronization with rise of the feedback clock signal CLKFBK. When both the comparison results UP and DN rise, the AND circuit 113 causes its output to rise. Thereby, the flip-flops 111 and 112 are initialized, so that both the comparison results UP and DN fall.

For example, when there is no phase difference between the reference clock signal CLKREF and the feedback clock signal CLKFBK, the phase comparator 11 outputs the comparison results UP and DN having the same pulse width. On the other hand, when there is a phase difference between the reference clock signal CLKREF and the feedback clock signal CLKFBK, the phase comparator 11 outputs the comparison results UP and DN whose pulse widths are different from each other. More specifically, when the phase of the feedback clock signal CLKFBK is delayed from the phase of the reference clock signal CLKREF, the pulse width of the comparison result UP is made longer than the pulse width of the comparison result DN, and when the phase of the feedback clock signal CLKFBK is advanced beyond the phase of the reference clock signal CLKREF, the pulse width of the comparison result DN is made longer than the pulse width of the comparison result UP.

(Details of First Path)

First, a path (first path) from the phase comparator 11 to the voltage controlled oscillator 19 through the charge pump 12 and the filter 15 will be described. In the first path, the filter 15 does not have a charge holding function and a phase difference is fine-tuned every time the phase comparator 11 performs comparison. Hereinafter, a path where phase control is performed is also referred to as a proportional path.

The charge pump 12 generates a current Icprop corresponding to the comparison results UP and DN of the phase comparator 11.

Figure 3:
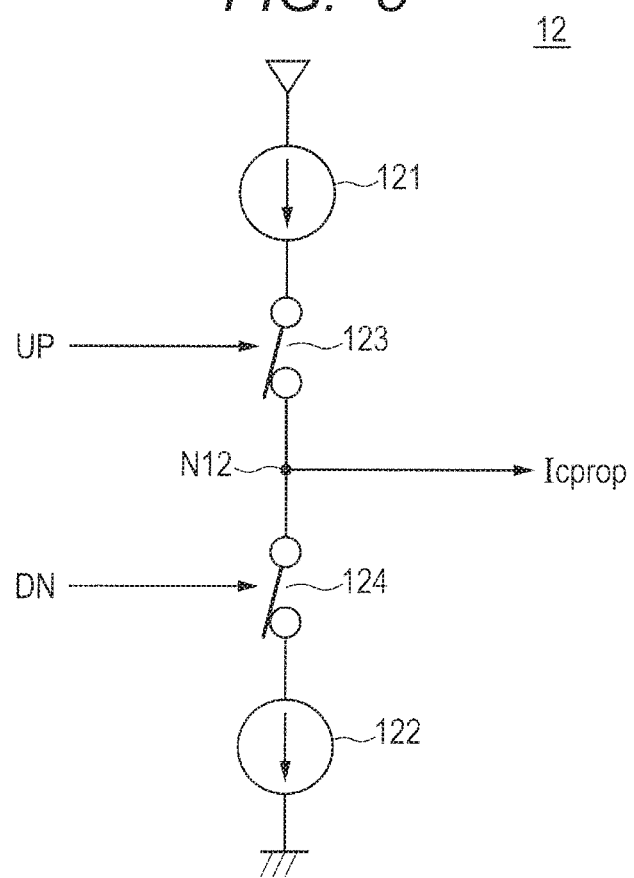
FIG. 3 is a diagram showing a configuration example of a first charge pump provided in the PLL circuit shown in FIG. 1.

FIG. 3 is a diagram showing a configuration example of the charge pump 12. As shown in FIG. 3, the charge pump 12 has constant current sources 121 and 122 and switch elements (current supply control switches) 123 and 124. Each of the switch elements 123 and 124 is, for example, an N-channel MOS transistor.

The constant current source 121 and the switch element 123 are provided between a power supply voltage terminal (hereinafter referred to as a power supply voltage terminal VDD) from which the power supply voltage VDD is supplied and an output terminal (node N12) of the charge pump 12. The switch element 123 is controlled to be turned on or off based on the comparison result UP. The constant current source 122 and the switch element 124 are provided between a ground voltage terminal (hereinafter referred to as a ground voltage terminal GND) from which a ground voltage GND is supplied and the node N12. The switch element 124 is controlled to be turned on or off based on the comparison result DN.

For example, when the pulse widths of the comparison results UP and DN are the same, the switch elements 123 and 124 are turned on for the same period, so that the current Ic generated by the charge pump 12 is zero. On the other hand, when the pulse width of the comparison result UP is longer than the pulse width of the comparison result DN, the charge pump 12 generates a positive polarity current Ic for a period corresponding to a difference between the pulse widths (that is, a phase difference). Thereby, electric charges are accumulated in the filter 15. When the pulse width of the comparison result DN is longer than the pulse width of the comparison result UP, the charge pump 12 generates a negative polarity current Icprop for a period corresponding to a difference between the pulse widths (that is, a phase difference). Thereby, the electric charges accumulated in the filter 15 are extracted. The charge pump 12 may be configured to switch a maximum value of the current Icprop according to an operation mode.

The filter 15 generates a control voltage Vcprop obtained by removing ripple noise from a voltage generated based on the current Icprop outputted from the charge pump 12.

Figure 4:
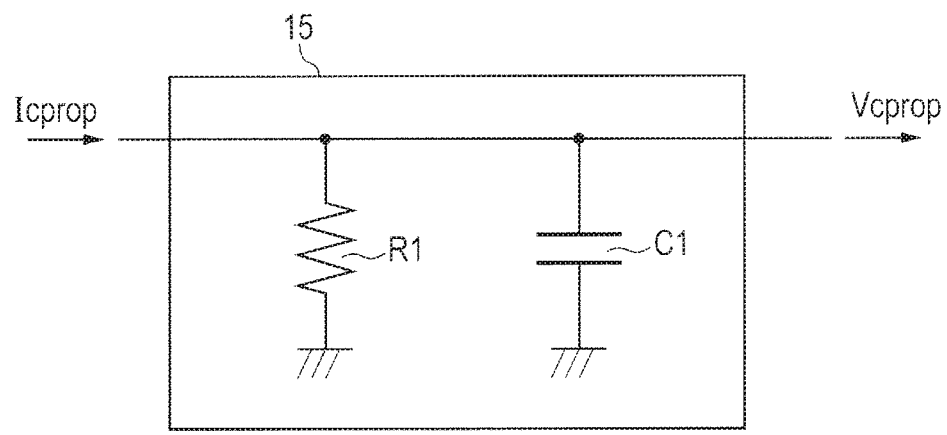
FIG. 4 is a diagram showing a configuration example of a first filter provided in the PLL circuit shown in FIG. 1.

FIG. 4 is a diagram showing a configuration example of the filter 15. As shown in FIG. 4, the filter 15 has a resistive element R1 and a capacitative element C1. The resistive element R1 is provided between the ground voltage terminal GND and the output terminal of the charge pump 12. The capacitative element C1 is provided in parallel with the resistive element R1.

(Details of Second Path)

Next, a path (second path) from the phase comparator 11 to the voltage controlled oscillator 19 through the charge pump 13 and the filter 16 will be described. In the second path, the filter 16 has a charge holding function and holds frequency information. Hereinafter, a path where frequency control is performed is also referred to as an integral path.

The charge pump 13 has the same circuit configuration as that of the charge pump 12 and generates a current Icint corresponding to the comparison results UP and DN of the phase comparator 11.

(First Configuration Example of Charge Pump 13)

Figure 5:
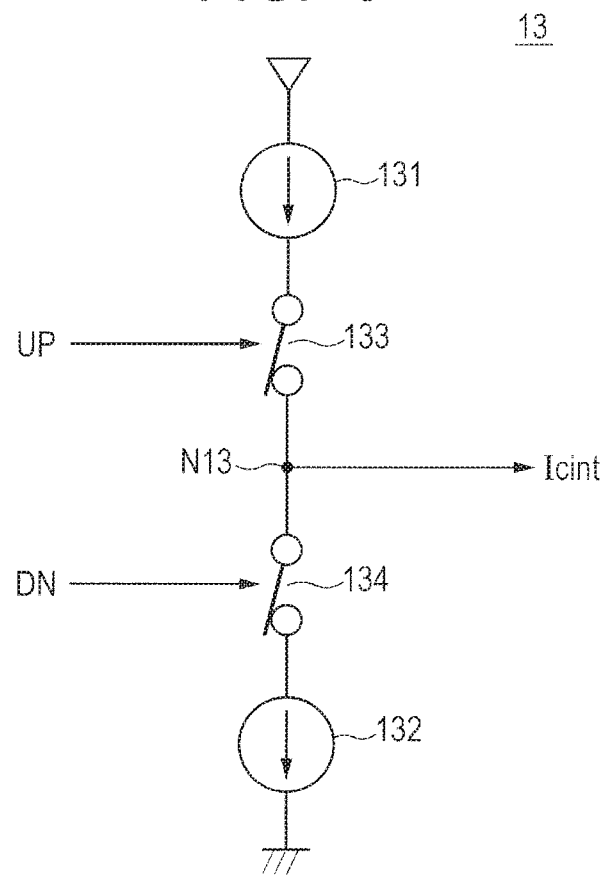
FIG. 5 is a diagram showing a first configuration example of a second charge pump provided in the PLL circuit shown in FIG. 1.

FIG. 5 is a diagram showing a first configuration example of the charge pump 13. The charge pump 13 has constant current sources 131 and 132 and switch elements 133 and 134. The constant current sources 131 and 132 and the switch elements 133 and 134 of the charge pump 13 respectively correspond to the constant current sources 121 and 122 and the switch elements 123 and 124 of the charge pump 12. The other components and operations of the charge pump 13 are the same as those of the charge pump 12, so the descriptions thereof are omitted.

Figure 6:
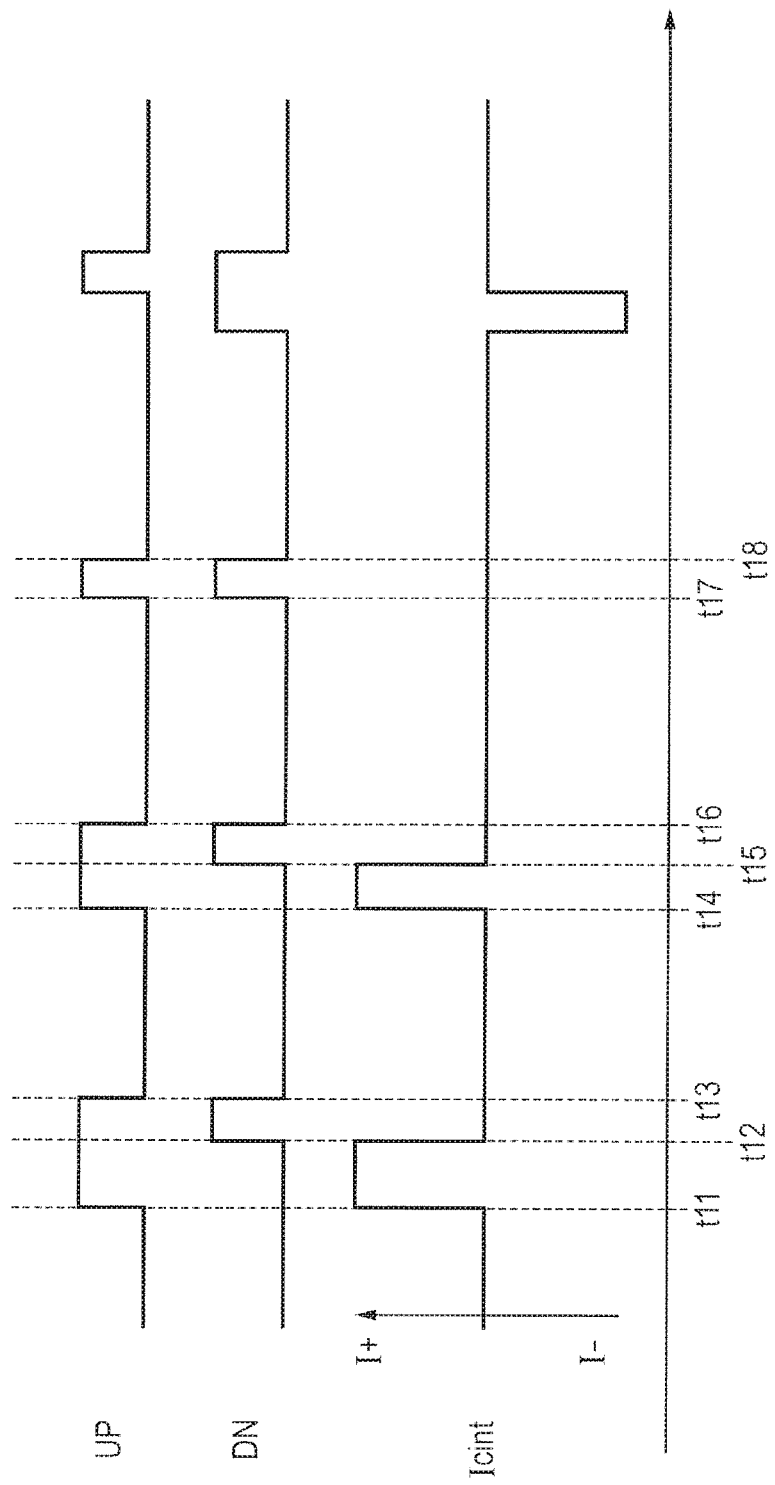
FIG. 6 is a timing chart showing an operation of the second charge pump shown in FIG. 5.

FIG. 6 is a timing chart showing an operation of the charge pump 13.

In the example of FIG. 6, the phase of the feedback clock signal CLKFBK is delayed from the phase of the reference clock signal CLKREF, so that the pulse width of the comparison result UP (time t11 to t13) is longer than the pulse width of the comparison result DN (time t12 to t13) by a difference of the phases. At this time, the charge pump outputs a positive polarity current Icint for a period corresponding to a difference between the pulse widths (time t11 to t12).

Thereafter, when frequency control of an oscillation signal (output clock signal CLKOUT) is performed and thereby a phase difference between the feedback clock signal CLKFBK and the reference clock signal CLKREF is reduced, a difference between the pulse width of the comparison result UP (time t14 to t16) and the pulse width of the comparison result DN (time t15 to t16) is also reduced along with the reduction of the phase difference. Thereby, an output period of the positive polarity current Icint is also reduced (time t14 to t15).

When the phase difference between the feedback clock signal CLKFBK and the reference clock signal CLKREF becomes zero, the difference between the pulse width of the comparison result UP and the pulse width of the comparison result DN also becomes zero (time t17 to t18). Thereby, the output current Icint of the charge pump 13 ideally becomes zero.

(Second Configuration Example of Charge Pump 13)

Figure 7:
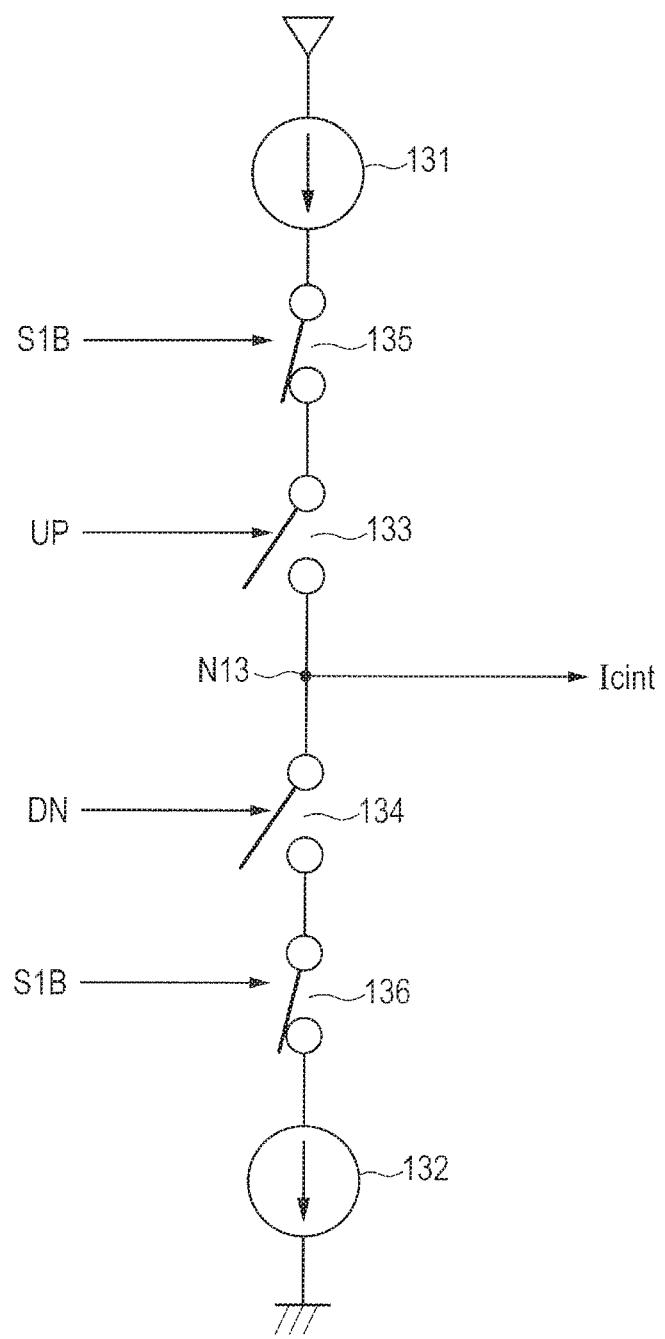
FIG. 7 is a diagram showing a second configuration example of the second charge pump provided in the PLL circuit shown in FIG. 1.

FIG. 7 is a diagram showing a second configuration example of the charge pump 13 as a charge pump 13a. The charge pump 13a further includes switch elements 135 and 136 as compared with the charge pump 13. The switch element 135 is provided in series to the switch element 133 and is controlled to be turned on or off based on an inversion signal S1B of a mode switching signal S1. The switch element 136 is provided in series to the switch element 134 and is controlled to be turned on or off based on the inversion signal S1B of the mode switching signal S1.

For example, when the mode switching signal S1 is L level (the inversion signal S1B is H level), both the switch elements 135 and 136 are turned on. Therefore, the charge pump 13a performs the same operation as that of the charge pump 13. On the other hand, when the mode switching signal S1 is H level (the inversion signal S1B is L level), both the switch elements 135 and 136 are turned off. Therefore, the charge pump 13a does not output the current Icint.

Figure 8:
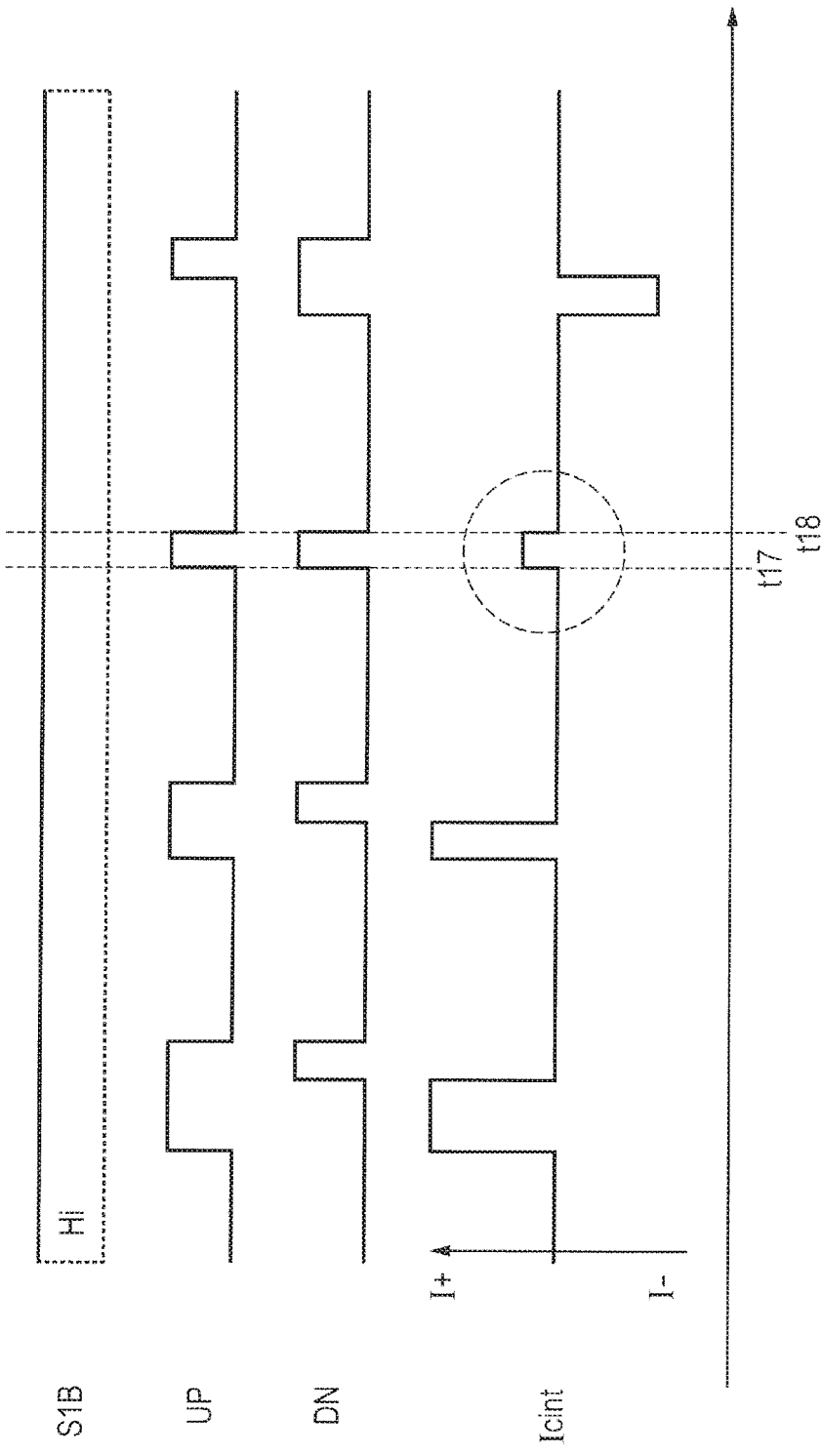
FIG. 8 is a timing chart showing an operation of the second charge pump shown in FIG. 7.

FIG. 8 is a timing chart showing an operation of the charge pump 13a.

In the example of FIG. 8, the inversion signal S1B of the mode switching signal S1 is fixed to H level, so that the charge pump 13a performs the same operation as that of the charge pump 13 shown in FIG. 6. However, when there is variation of on-resistance between the switch elements 135 and 136, even if the phase difference between the feedback clock signal CLKFBK and the reference clock signal CLKREF becomes zero and thereby the difference between the pulse width of the comparison result UP and the pulse width of the comparison result DN also becomes zero, the output current Icint of the charge pump 13a may not become zero (time t17 to t18). In this case, there is a possibility that a steady phase difference (phase offset) occurs between the feedback clock signal CLKFBK and the reference clock signal CLKREF.

In this way, in the charge pump 13, a configuration of the charge pump 13a that is driven only in a normal lock mode (only in a case where the inversion signal S1B of the mode switching signal S1 is H level) may be employed. Thereby, an increase in power consumption is suppressed. Further, a voltage variation of a node N1 in a high-speed lock mode is suppressed. However, in this case, it should be noted that a steady phase difference (phase offset) may occur between the feedback clock signal CLKFBK and the reference clock signal CLKREF.

(Third Configuration Example of Charge Pump 13)

Figure 9:
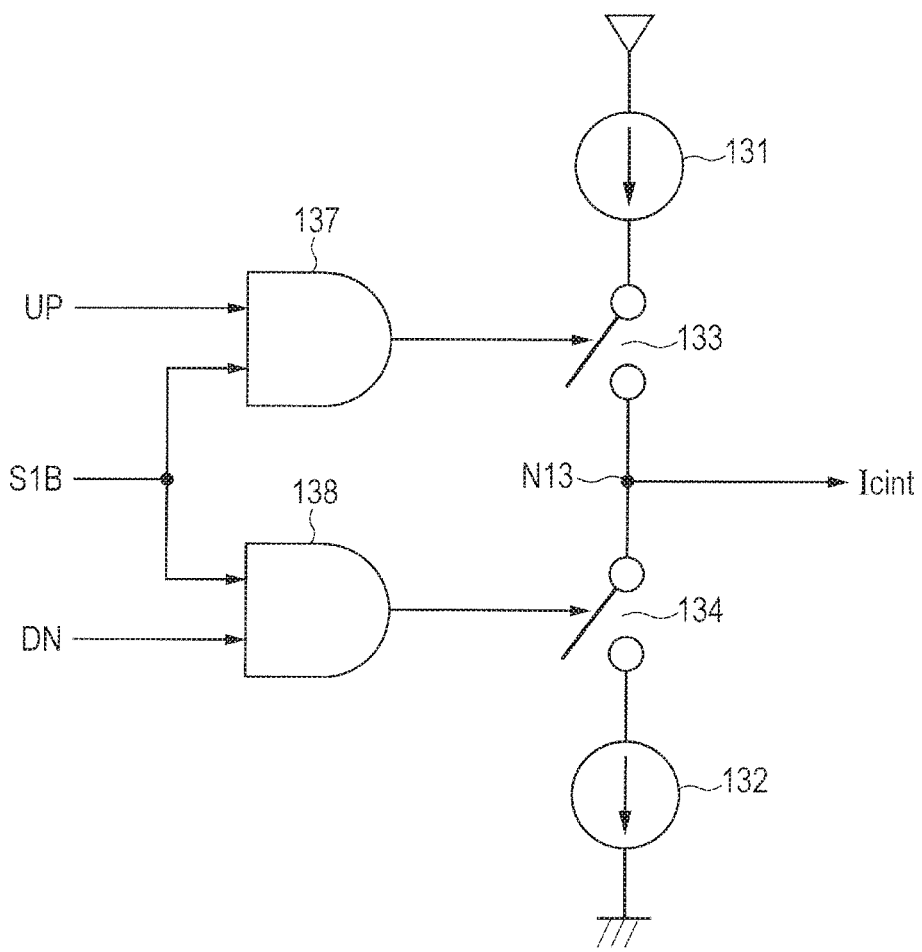
FIG. 9 is a diagram showing a third configuration example of the second charge pump provided in the PLL circuit shown in FIG. 1.

FIG. 9 is a diagram showing a third configuration example of the charge pump 13 as a charge pump 13b. The charge pump 13b further includes logical AND circuits (AND circuits) 137 and 138 as compared with the charge pump 13. The AND circuit 137 outputs a logical AND of the comparison result UP and the inversion signal S1B of the mode switching signal S1. The AND circuit 138 outputs a logical AND of the comparison result DN and the inversion signal S1B of the mode switching signal S1. The switch element 133 is controlled to be turned on or off based on an output of the AND circuit 137.
The switch element 134 is controlled to be turned on or off based on an output of the AND circuit 138.

For example, when the mode switching signal S1 is L level (the inversion signal S1B is H level), the AND circuits 137 and 138 respectively output the comparison results UP and DN without change. Therefore, the charge pump 13b performs the same operation as that of the charge pump 13. On the other hand, when the mode switching signal S1 is H level (the inversion signal S1B is L level), the AND circuits 137 and 138 respectively mask the comparison results UP and DN and output a L level signal. Therefore, the charge pump 13b does not output the current Icint.

Figure 10:
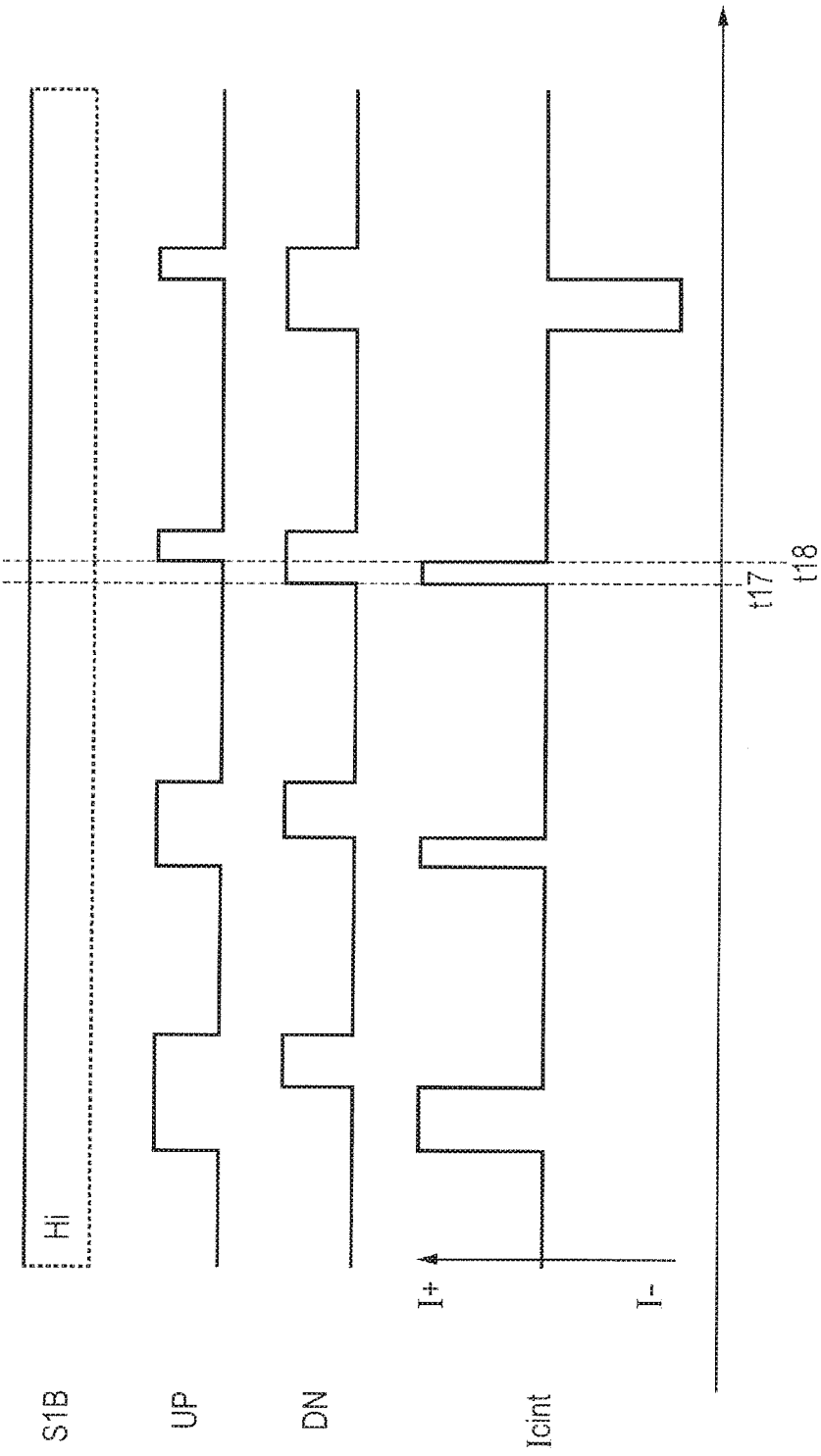
FIG. 10 is a timing chart showing an operation of the second charge pump shown in FIG. 9.

FIG. 10 is a timing chart showing an operation of the charge pump 13b.

In the example of FIG. 10, the inversion signal S1B of the mode switching signal S1 is fixed to H level, so that the charge pump 13b performs the same operation as that of the charge pump 13 shown in FIG. 6. However, when there is variation of manufacturing between the AND circuits 137 and 138, even if the phase difference between the feedback clock signal CLKFBK and the reference clock signal CLKREF becomes zero, the difference between the pulse width of the comparison result UP and the pulse width of the comparison result DN does not become zero. As a result, the output current Icint of the charge pump 13a may not become zero (time t17 to t18). In this case, there is a possibility that a steady phase difference (phase offset) occurs between the feedback clock signal CLKFBK and the reference clock signal CLKREF.

In this way, in the charge pump 13, a configuration of the charge pump 13b that is driven only in the normal lock mode (only in a case where the inversion signal S1B of the mode switching signal S1 is H level) may be employed. Thereby, an increase in power consumption is suppressed. Further, a voltage variation of the node N1 in the high-speed lock mode is suppressed. However, in this case, it should be noted that a steady phase difference (phase offset) may occur between the feedback clock signal CLKFBK and the reference clock signal CLKREF.

The filter 16 generates the control voltage Vcint by integrating a current flowing through the node N1 that couples between the charge pump 13 and the filter 16. Although described in detail later, when the reference voltage Vref is applied to the node N1 in the high-speed lock mode, the filter 16 generates the control voltage Vcint indicating the reference voltage Vref regardless of the output current Icint of the charge pump 13, and in the case of the normal lock mode, the filter 16 generates the control voltage Vcint by integrating the output current Icint of the charge pump 13.

Figure 11:
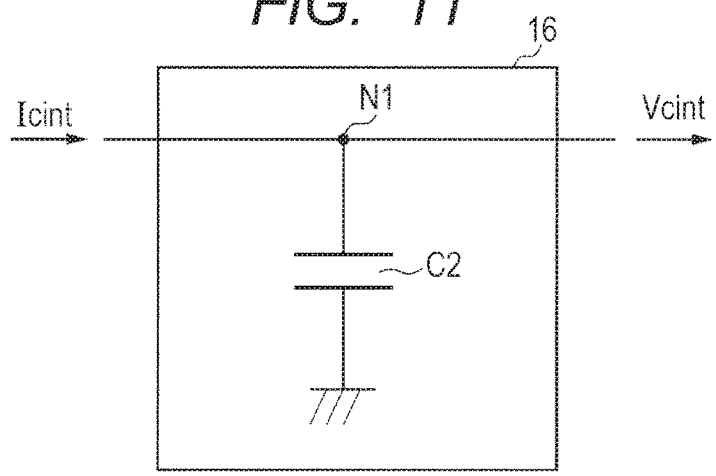
FIG. 11 is a diagram showing a configuration example of a second filter provided in the PLL circuit shown in FIG. 1.

FIG. 11 is a diagram showing a configuration example of the filter 16. As shown in FIG. 11, the filter 16 has a capacitive element C2. The capacitive element C2 is provided between the ground voltage terminal GND and the node N1 (the output terminal of the charge pump 13).

(Details of Third Path)

Next, a path (third path) from the phase comparator 11 to the voltage controlled oscillator 19 through the charge pump 14 or the comparator 18 and the filter 17 will be described.

In the case of the high-speed lock mode (that is, in the case where the mode switching signal S1 is H level), the charger pump 14 is driven and generates a current Icgmc corresponding to the comparison results UP and DN of the phase comparator 11.

(First Configuration Example of Charge Pump 14)

Figure 12:
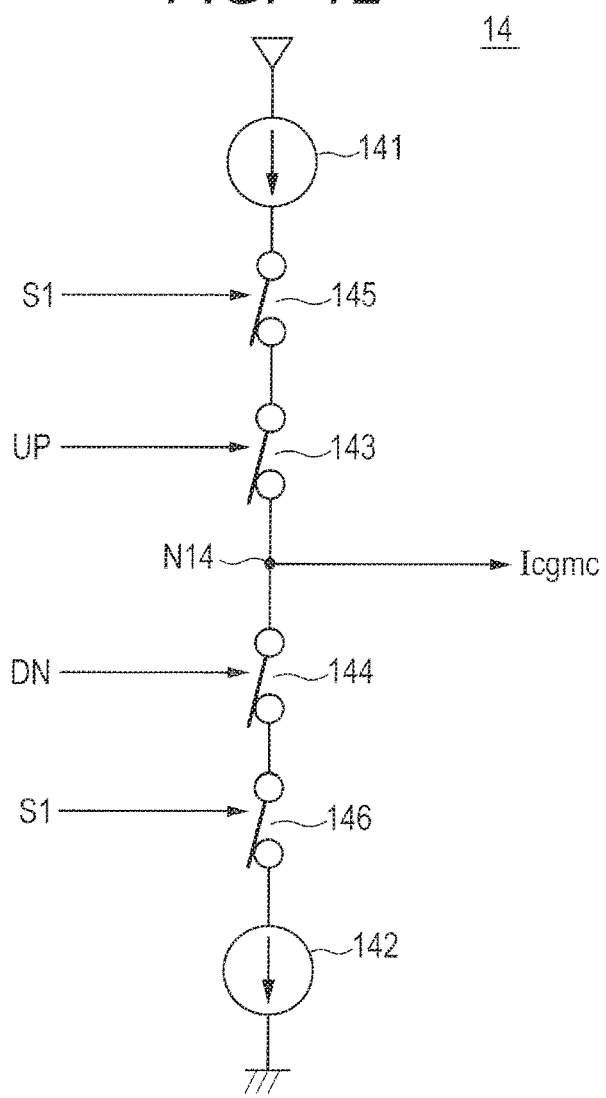
FIG. 12 is a diagram showing a first configuration example of a third charge pump provided in the PLL circuit shown in FIG. 1.

FIG. 12 is a diagram showing a first configuration example of the charger pump 14. The charge pump 14 has constant current sources 141 and 142 and switch elements 143 to 146. The constant current sources 141 and 142 and the switch elements 143 and 144 of the charge pump 14 respectively correspond to the constant current sources 131 and 132 and the switch elements 133 and 134 of the charge pump 13. The switch element 145 is provided in series to the switch element 143 and is controlled to be turned on or off based on the mode switching signal S1. The switch element 146 is provided in series to the switch element 144 and is controlled to be turned on or off based on the mode switching signal S1.

For example, when the mode switching signal S1 is H level, both the switch elements 145 and 146 are turned on. Therefore, the charge pump 14 performs the same operation as that of the charge pump 13. On the other hand, when the mode switching signal S1 is L level, both the switch elements 145 and 146 are turned off. Therefore, the charge pump 14 does not output the current Icgmc.

Figure 13:
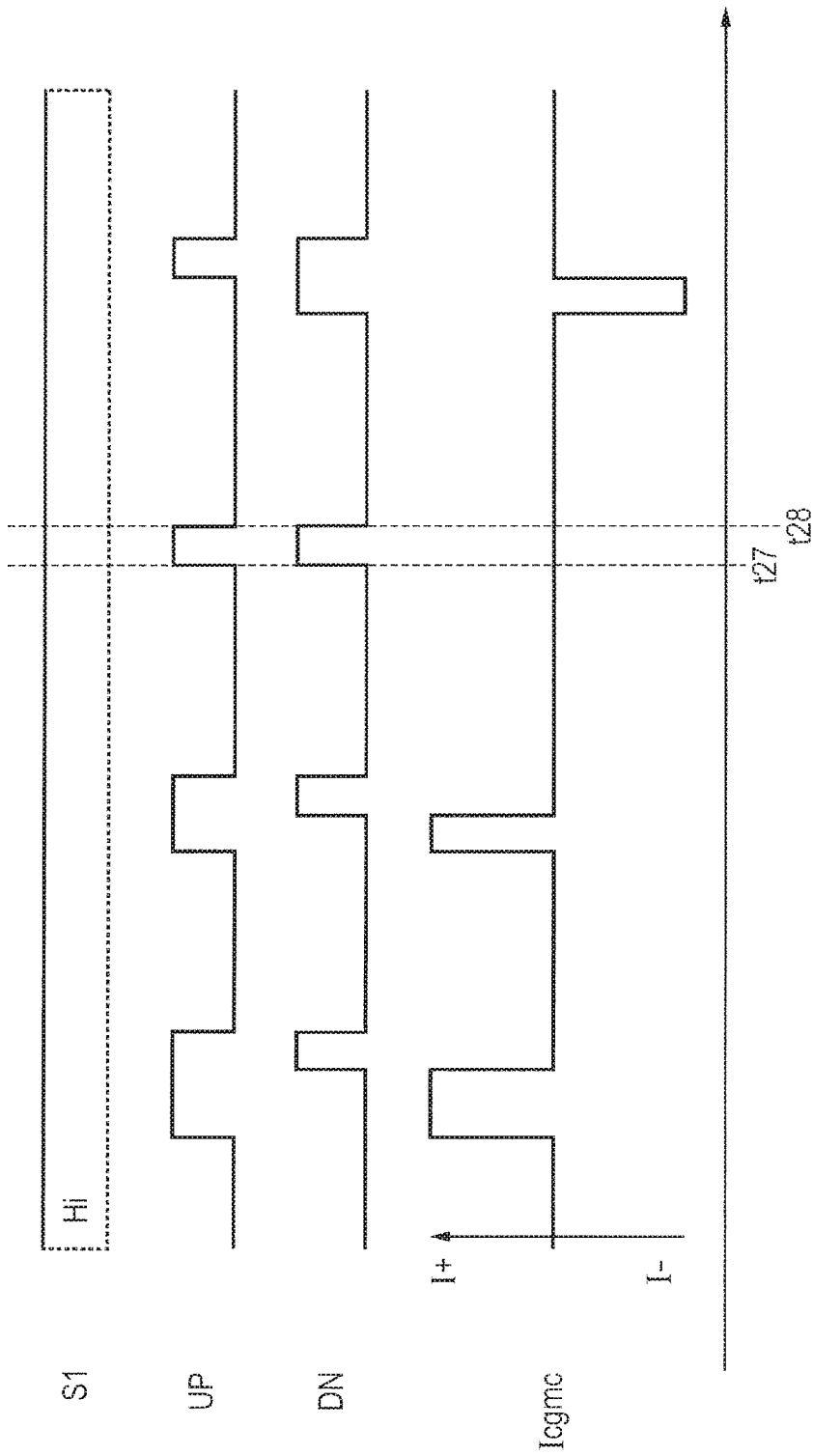
FIG. 13 is a timing chart showing an operation of the third charge pump shown in FIG. 12.

FIG. 13 is a timing chart showing an operation of the charge pump 14.

In the example of FIG. 13, the mode switching signal S1 is fixed to H level, so that the charge pump 14 performs the same operation as that of the charge pump 13. However, when there is variation of on-resistance between the switch elements 145 and 146, even if the phase difference between the feedback clock signal CLKFBK and the reference clock signal CLKREF becomes zero and thereby the difference between the pulse width of the comparison result UP and the pulse width of the comparison result DN also becomes zero, the output current Icgmc of the charge pump 14 may not become zero (time t27 to t28). In this case, there is a possibility that a steady phase difference (phase offset) occurs between the feedback clock signal CLKFBK and the reference clock signal CLKREF.

In this way, in the charge pump 14, a configuration where the charge pump 14 is driven only in the high-speed lock mode (only in a case where the mode switching signal S1 is H level) is employed. However, in this case, it should be noted that a steady phase difference (phase offset) may occur between the feedback clock signal CLKFBK and the reference clock signal CLKREF.

(Second Configuration Example of Charge Pump 14)

Figure 14:
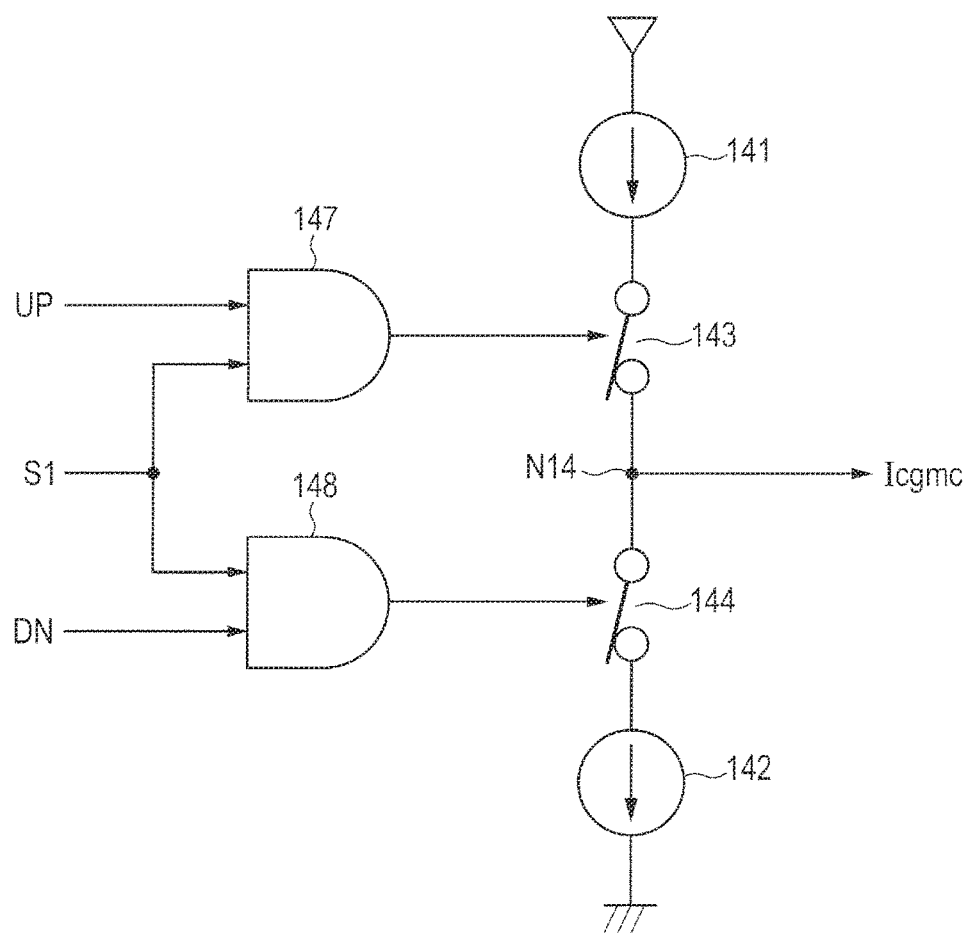
FIG. 14 is a diagram showing a second configuration example of the third charge pump provided in the PLL circuit shown in FIG. 1.

FIG. 14 is a diagram showing a second configuration example of the charge pump 14 as a charge pump 14b. The charge pump 14a has constant current sources 141 and 142, switch elements 143 and 144, and logical AND circuits (AND circuits) 147 and 148. The constant current sources 141 and 142 and the switch elements 143 and 144 of the charge pump 14a respectively correspond to the constant current sources 131 and 132 and the switch elements 133 and 134 of the charge pump 13. The AND circuit 147 outputs a logical AND of the comparison result UP and the mode switching signal 51. The AND circuit 148 outputs a logical AND of the comparison result DN and the mode switching signal 51. The switch element 143 is controlled to be turned on or off based on an output of the AND circuit 147. The switch element 144 is controlled to be turned on or off based on an output of the AND circuit 148.

For example, when the mode switching signal 51 is H level, the AND circuits 147 and 148 respectively output the comparison results UP and DN without change. Therefore, the charge pump 14a performs the same operation as that of the charge pump 13. On the other hand, when the mode switching signal 51 is L level, the AND circuits (mask circuits) 147 and 148 respectively mask the comparison results UP and DN and output a L level signal. Therefore, the charge pump 14a does not output the current Icgmc.

Figure 15:
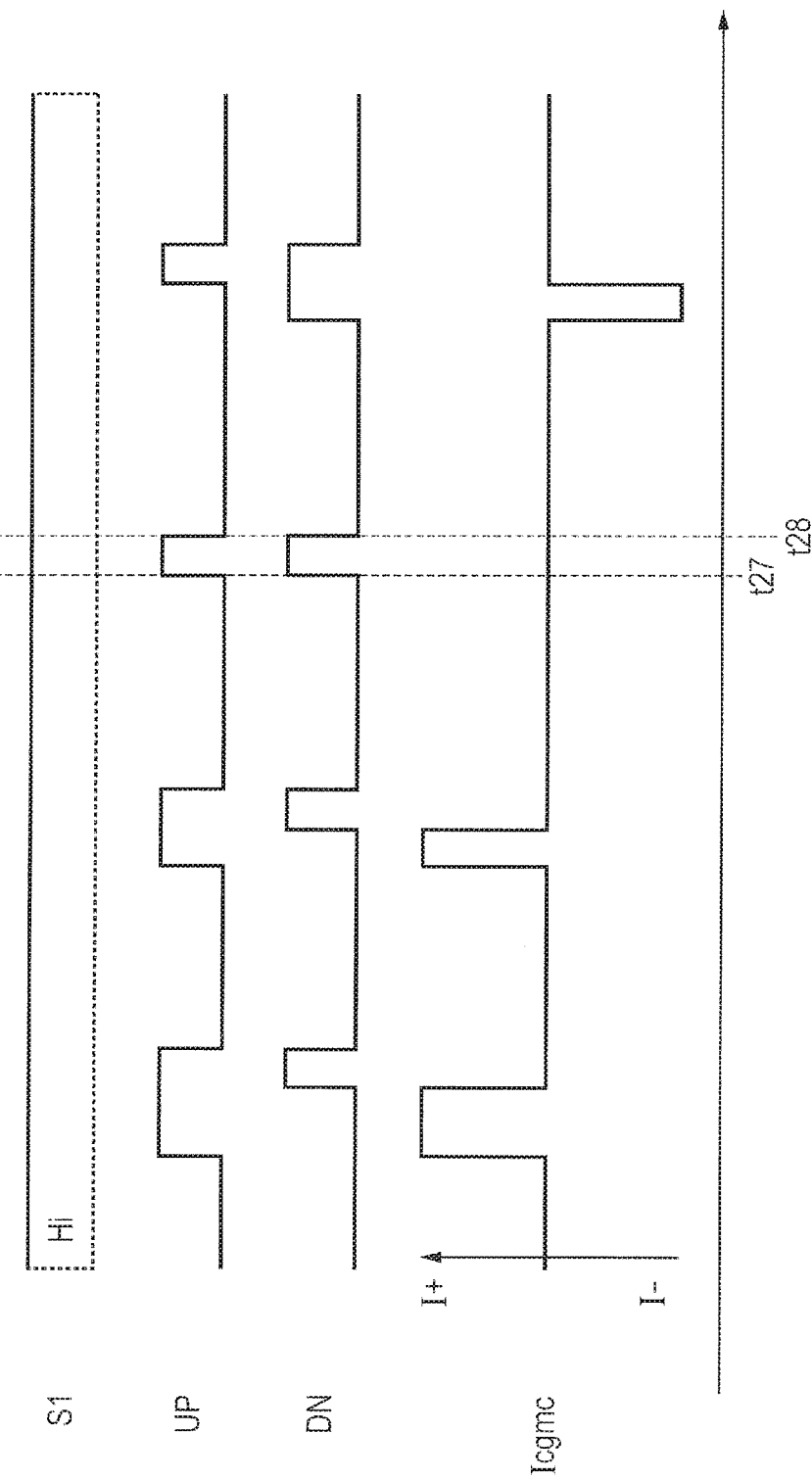
FIG. 15 is a timing chart showing an operation of the third charge pump shown in FIG. 14.

FIG. 15 is a timing chart showing an operation of the charge pump 14a.

In the example of FIG. 15, the mode switching signal S1 is fixed to H level, so that the charge pump 14a performs the same operation as that of the charge pump 13. However, when there is variation of manufacturing between the AND circuits 147 and 148, even if the phase difference between the feedback clock signal CLKFBK and the reference clock signal CLKREF becomes zero, the difference between the pulse width of the comparison result UP and the pulse width of the comparison result DN does not become zero. As a result, the output current Icgmc of the charge pump 14a may not become zero (time t27 to t28). In this case, there is a possibility that a steady phase difference (phase offset) occurs between the feedback clock signal CLKFBK and the reference clock signal CLKREF.

In this way, in the charge pump 14, a configuration of the charge pump 14a that is driven only in the high-speed lock mode (only in a case where the mode switching signal 51 is H level) may be employed. However, in this case, it should be noted that a steady phase difference (phase offset) may occur between the feedback clock signal CLKFBK and the reference clock signal CLKREF.

The charge pump 14 is not limited to the configuration described above but may have the same configuration as that of the charge pump 13 shown in FIG. 5 that constantly operates regardless of the mode switching signal 51. In this case, a switch element SW2, which is turned on in the case of the high-speed lock mode and is turned off in the case of the normal lock mode, is required to be provided between the charge pump 14 and a node N2.

Let us return to FIG. 1 and continue the description.

The switch element SW1 (switch section) is provided between a reference voltage terminal (hereinafter referred to as a reference voltage terminal Vref) to which the reference voltage Vref is supplied and the node N1. The switch element SW1 is turned on in the case of the high-speed lock mode (that is, in the case where the mode switching signal S1 is H level) and is turned off in the case of the normal lock mode (that is, in the case where the mode switching signal S1 is L level).

Figure 16:
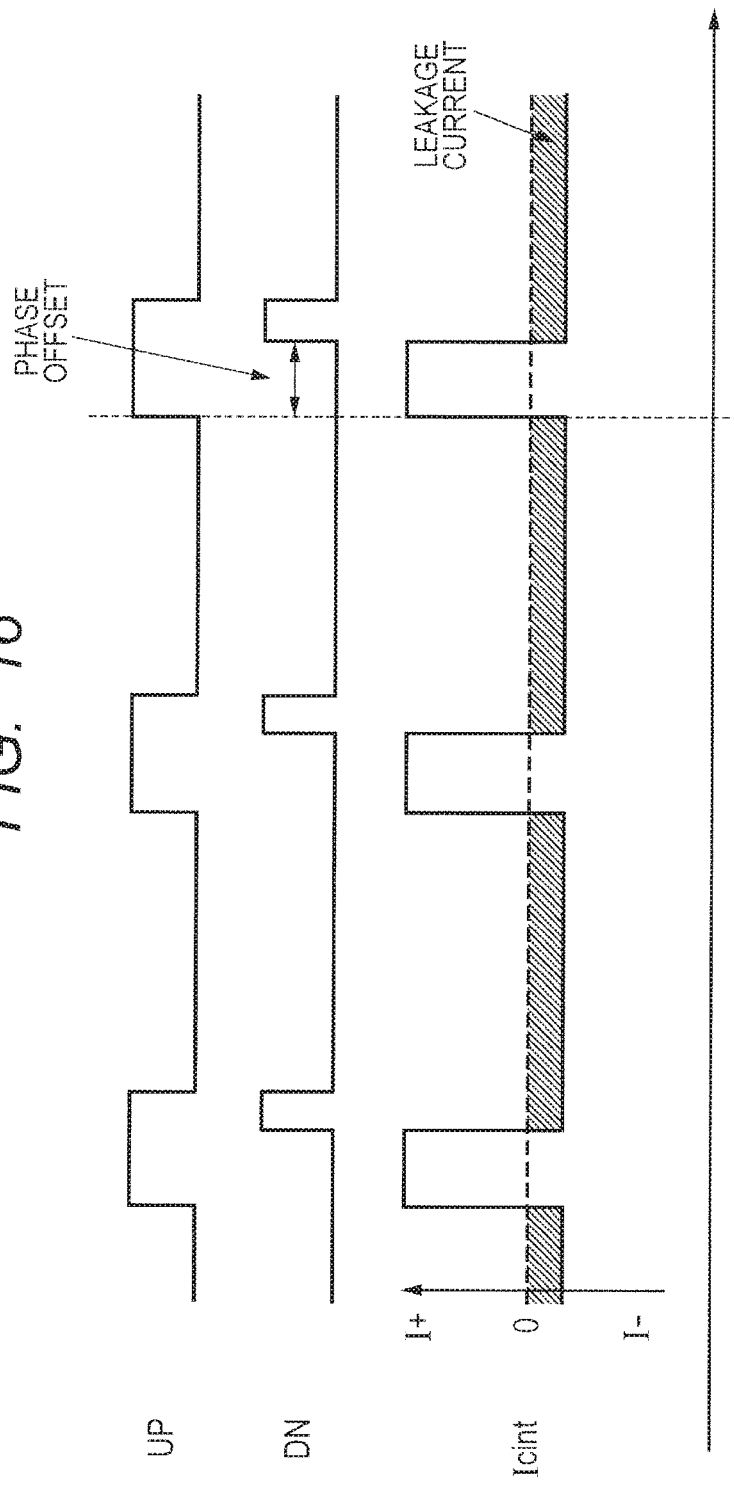
FIG. 16 is a diagram for explaining a leak current flowing through a node N1 and a phase offset caused by the leak current.

It is preferable that the switch element SW1 has the largest possible on-resistance. For example, it is preferable that the on-resistance of the switch element SW1 is greater than at least the on-resistance of the switch element SW2. Thereby, it is possible to suppress a leak current flowing from the node N1 to the reference voltage terminal Vref through the switch element SW1 which is in an off state, so that the phase offset is suppressed (see FIG. 16). Here, a path between the node N1 and the reference voltage terminal Vref is not a path for flowing a current, so that even when the on-resistance of the switch element SW1 is large, no potential difference occurs between two input terminals of the comparator 18.

The comparator 18 compares a voltage (the control voltage Vcint) of the node N1 and the reference voltage Vref and outputs a comparison result. For example, when the control voltage Vcint is greater than the reference voltage Vref, the comparator 18 outputs a positive polarity current, when the control voltage Vcint is smaller than the reference voltage Vref, the comparator 18 outputs a negative polarity current, and when the control voltage Vcint indicates the reference voltage Vref, the comparator 18 outputs no current.

The comparator 18 has an amplifier and a phase compensation capacitance, so that it takes time to activate the comparator 18. Therefore, the comparator 18 is preferred to be being operated regardless of the operation mode. In the present embodiment, the comparator 18 is being operated regardless of the operation mode.

The filter 17 has the same circuit configuration as that of the filter 16 and generates the control voltage Vcgmc by integrating a current flowing through the node N2 that couples between an output terminal of the charge pump 14 and an output terminal of the comparator 18. Although described in detail later, when no current is outputted from the comparator 18 in the high-speed lock mode, the filter 17 generates the control voltage Vcgmc by integrating the output current Icgmc of the charge pump 14, and when the operation of the charge pump 14 is stopped in the normal lock mode, the filter 17 generates the control voltage Vcgmc by integrating the comparison result of the comparator 18.

Figure 17:
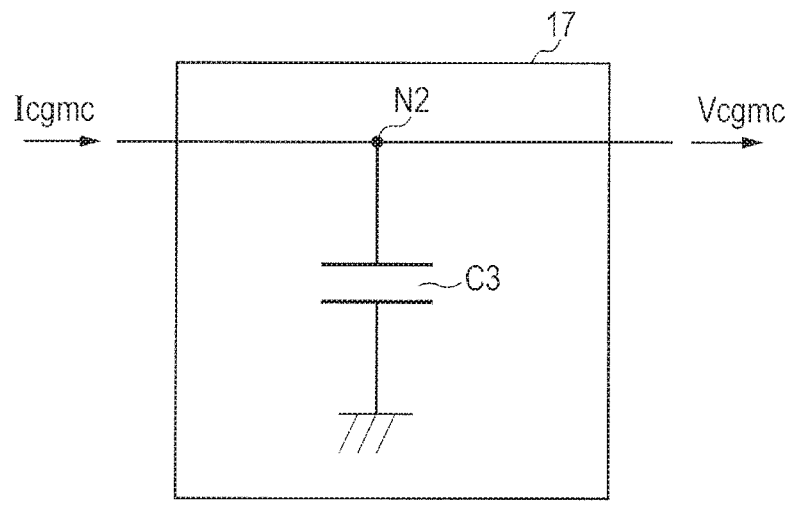
FIG. 17 is a diagram showing a configuration example of a third filter provided in the PLL circuit shown in FIG. 1.

FIG. 17 is a diagram showing a configuration example of the filter 17. As shown in FIG. 17, the filter 17 has a capacitative element C3. The capacitative element C3 is provided between the ground voltage terminal GND and the node N2.

The voltage controlled oscillator 19 mainly outputs an oscillation signal with a phase (and a frequency) according to the control voltage Vcprop and a frequency according to the control voltages Vcint and Vcgmc. For example, the voltage controlled oscillator 19 outputs the oscillation signal so that the higher the control voltages Vcprop, Vcint, and Vcgmc, the higher the frequency of the oscillation signal, and the lower the control voltages Vcprop, Vcint, and Vcgmc, the lower the frequency of the oscillation signal. The oscillation signal is outputted to the outside of the PLL circuit 1 as the output clock signal CLKOUT.

Figure 18:
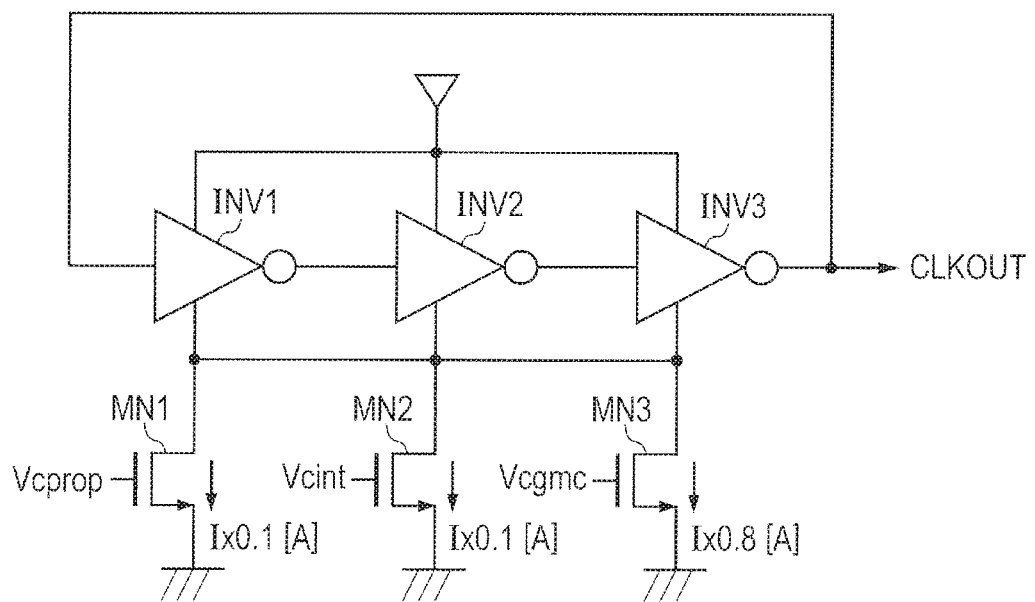
FIG. 18 is a diagram showing a configuration example of a voltage controlled oscillator provided in the PLL circuit shown in FIG. 1.

FIG. 18 is a diagram showing a configuration example of the voltage controlled oscillator 19.

As shown in FIG. 18, the voltage controlled oscillator 19 has invertors INV1 to INV3 and transistors MN1 to MN3. The invertors INV1 to INV3 are provided in a loop shape and an output of the invertor INV3 is outputted as the oscillation signal of the voltage controlled oscillator 19. The transistors MN1 to MN3 are provided in parallel between a low potential side power supply terminal of each of the invertors INV1 to INV3 and the ground voltage terminal GND, and an on-current of each of the transistors MN1 to MN3 is controlled by the control voltages Vcprop and Vcint. In other words, a delay amount of the invertors INV1 to INV3 is controlled by the control voltages Vcprop, Vcint, and Vcgmc.

For example, the transistors MN1 to MN3 are configured so that the size ratio (that is, a ratio of drain currents when the gate voltage is the same) of the transistors MN1 to MN3 is 1:1:8. Specifically, the transistor MN3 is configured by coupling eight transistors, each of which has the same size as that of the transistor MN1 or MN2, in parallel.

The frequency divider 20 frequency-divides the oscillation signal outputted from the voltage controlled oscillator 19 and outputs the frequency-divided oscillation signal as the feedback clock signal CLKFBK.

The lock detection unit 21 detects that the phase of the oscillation signal is locked and switches the mode switching signal S1, for example, from H level to L level. Thereby, the operation mode of the PLL circuit 1 is switched from the high-speed lock mode to the normal lock mode.

In this example, the lock detection unit 21 switches the mode switching signal S1, for example, from H level to L level after a predetermined period of time required for the phase of the oscillation signal is locked has elapsed from when the PLL circuit 1 was activated. Here, the lock detection unit 21 includes a counter that counts the number of times the reference clock signal CLKREF rises and a comparison circuit (mode switching circuit) that compares a count value of the counter with a predetermined value. When the count value of the counter reaches the predetermined value, the lock detection unit 21 determines that the predetermined period of time required for the phase of the oscillation signal is locked has elapsed and switches the mode switching signal S1, for example, from H level to L level.

(Operation of PLL Circuit 1)

Next, an operation of the PLL circuit 1 will be described.

(Operation of PLL Circuit 1 in High-Speed Lock Mode)

First, an operation of the PLL circuit 1 in the high-speed lock mode will be described. The high-speed lock mode is an operation mode including a period of time from when the PLL circuit 1 is activated to when the phase of the oscillation signal is locked. In the high-speed lock mode, a H level mode switching signal S1 is outputted from the lock detection unit 21.

Figure 19:
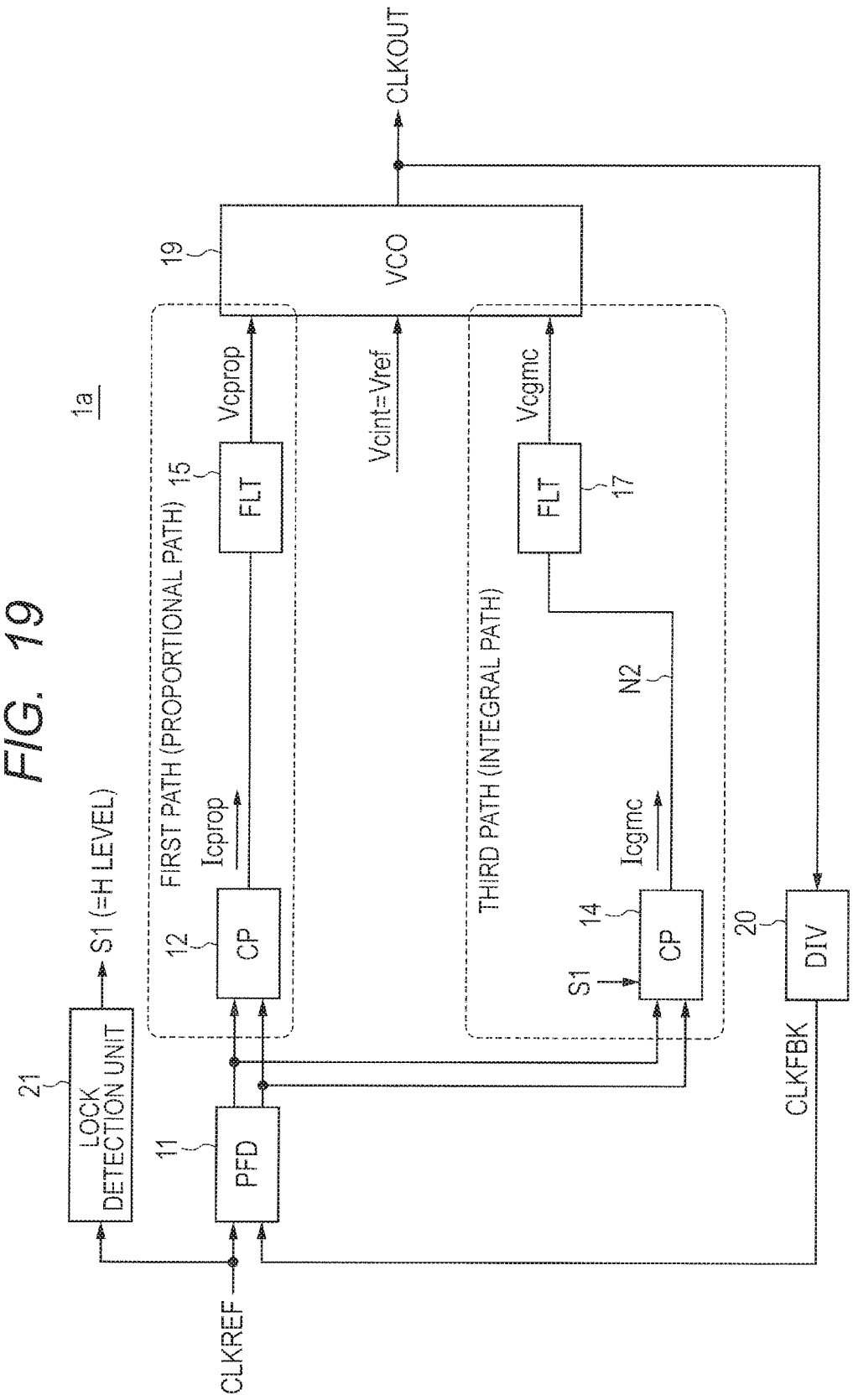
FIG. 19 is an equivalent circuit of the PLL circuit shown in FIG. 1 in a high-speed lock mode.

FIG. 19 is a diagram showing an equivalent circuit of the PLL circuit 1 in the high-speed lock mode as a PLL circuit 1a. Here, in the high-speed lock mode, the switch element SW1 is controlled to be on, so that the voltage of the node N1 indicates the reference voltage Vref. The reference voltage Vref is supplied to the two input terminals of the comparator 18, so that the comparator 18 output no current. Therefore, it is possible to assume that none of the charge pump 13 and the comparator 18 is operating.

At this time, the filter 16 generates the control voltage Vcint fixed to the reference voltage Vref.

At this time, the charge pump 14 generates a current Icgmc corresponding to the comparison results UP and DN of the phase comparator 11. The filter 17 generates the control voltage Vcgmc by integrating the current Icgmc outputted from the charge pump 14.

That is, the second path from the phase comparator 11 to the voltage controlled oscillator 19 through the charge pump 13 and the filter 16 is not used as an integral path for performing frequency control of the oscillation signal. On the other hand, the third path from the phase comparator 11 to the voltage controlled oscillator 19 through the charge pump 14 and the filter 17 is used as an integral path for performing frequency control of the oscillation signal.

The voltage controlled oscillator 19 mainly outputs an oscillation signal with a phase (and a frequency) according to the control voltage Vcprop and a frequency according to the control voltage Vcgmc. For example, the voltage controlled oscillator 19 outputs the oscillation signal so that the higher the control voltages Vcprop and Vcgmc, the higher the frequency of the oscillation signal, and the lower the control voltages Vcprop and Vcgmc, the lower the frequency of the oscillation signal. In the high-speed lock mode, the comparator 18 doses not function, so that control of an offset component of the oscillation frequency is not performed. Thereby, the voltage controlled oscillator 19 can quickly lock the phase without being restricted by moderate control of the offset component of the oscillation frequency.

(Operation of PLL Circuit 1 in Normal Lock Mode)

Next, an operation of the PLL circuit 1 in the normal lock mode will be described. The normal lock mode is an operation mode in a period of time after the phase of the oscillation signal is locked. In the normal lock mode, a L level mode switching signal S1 is outputted from the lock detection unit 21.

Figure 20:
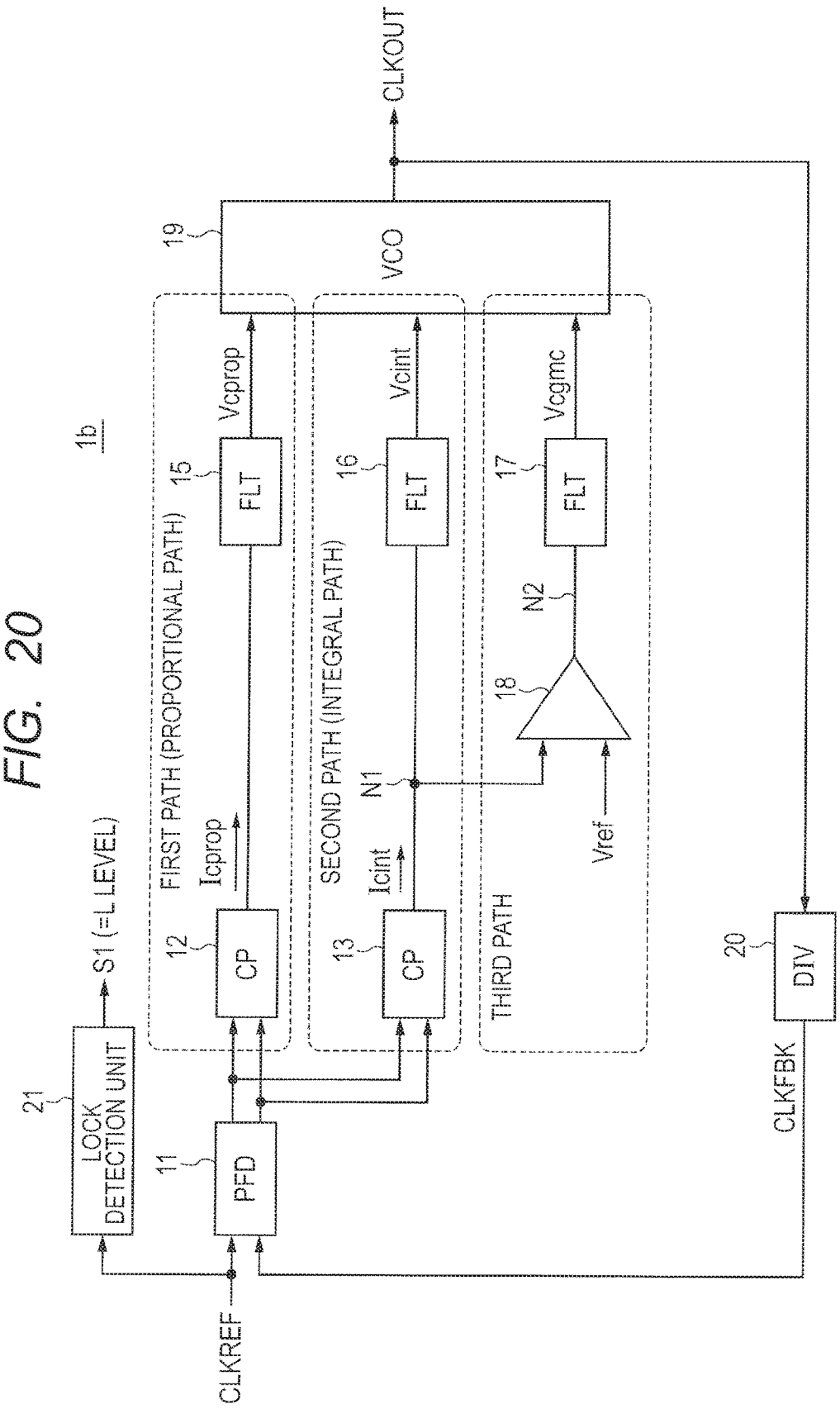
FIG. 20 is an equivalent circuit of the PLL circuit shown in FIG. 1 in a normal lock mode.

FIG. 20 is a diagram showing an equivalent circuit of the PLL circuit 1 in the normal lock mode as a PLL circuit 1b. Here, in the normal lock mode, the charge pump 14 does not operate. Further, in the normal lock mode, the switch element SW1 is controlled to be off, so that the current Icint of the charge pump 13 flows through the node N1.

At this time, the filter 16 generates the control voltage Vcint by integrating the output current Icint of the charge pump 13. Therefore, the voltage of the node N1 indicates the control voltage Vcint generated by integrating the current Icint by using the filter 16.

At this time, the comparator 18 compares the control voltage Vcint (the voltage of the node N1) generated by integrating the current Icint by using the filter 16 with the reference voltage Vref and outputs a comparison result. For example, when the control voltage Vcint is greater than the reference voltage Vref, the comparator 18 outputs a positive polarity current, when the control voltage Vcint is smaller than the reference voltage Vref, the comparator 18 outputs a negative polarity current, and when the control voltage Vcint indicates the reference voltage Vref, the comparator 18 outputs no current. The filter 17 generates the control voltage Vcgmc by integrating the comparison result of the comparator 18 (the current flowing through the node N2).

That is, the second path from the phase comparator 11 to the voltage controlled oscillator 19 through the charge pump 13 and the filter 16 is used as an integral path for performing frequency control of the oscillation signal. On the other hand, the third path from the phase comparator 11 to the voltage controlled oscillator 19 through the charge pump 13, the comparator 18, and the filter 17 is used as a second integral path for performing the control of the offset component of the oscillation frequency.

The voltage controlled oscillator 19 mainly outputs an oscillation signal with a phase (and a frequency) according to the control voltage Vcprop and a frequency according to the control voltages Vcint and Vcgmc. In the normal lock mode, the control of the offset component of the oscillation frequency is performed as described above. That is, in a stable state after the phase is locked, the voltage controlled oscillator 19 can generate an oscillation signal with a highly accurate oscillation frequency and suppressed noise by performing control of the oscillation signal including moderate control of the offset component of the oscillation frequency.

Figure 21:
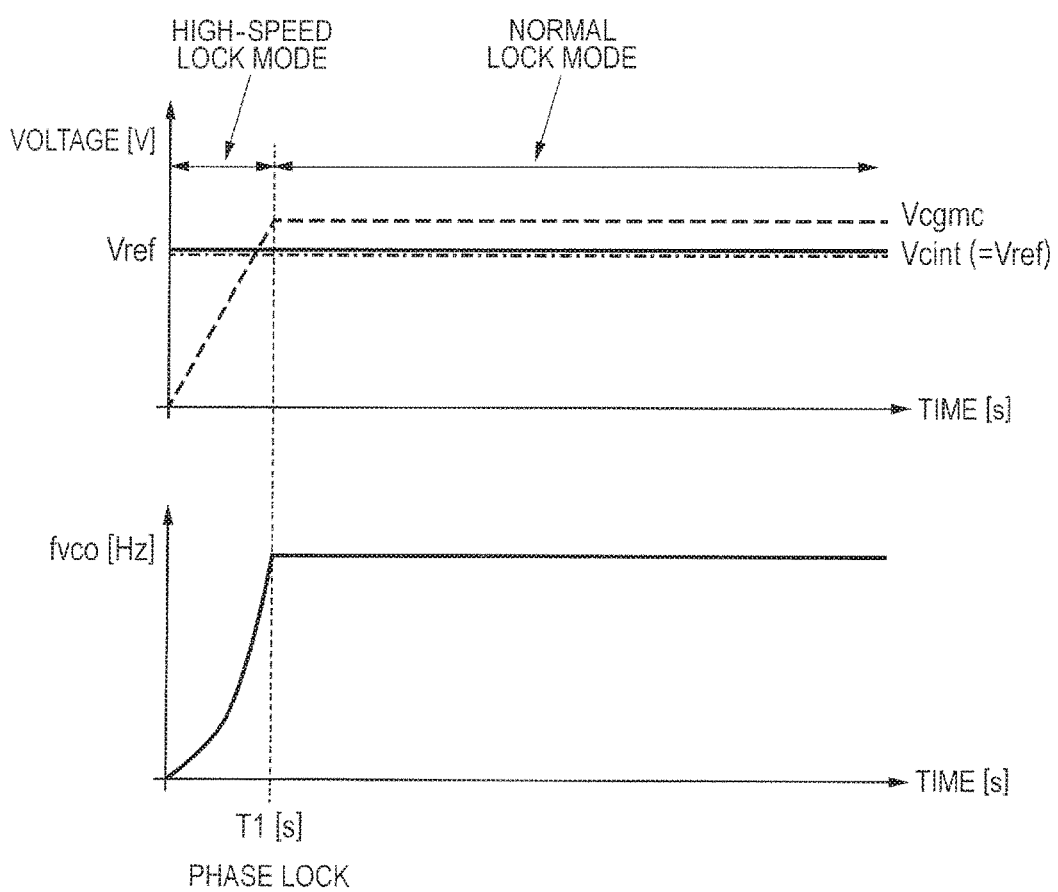
FIG. 21 is a timing chart for explaining effects of the PLL circuit shown in FIG. 1.

FIG. 21 is a timing chart showing an operation of the PLL circuit 1. As shown in FIG. 21, the PLL circuit 1 sets the operation mode to the high-speed lock mode when the PLL circuit 1 is activated. Thereby, the PLL circuit 1 can quickly lock the phase of the oscillation signal without being restricted by moderate control of the offset component of the oscillation frequency. In the example of FIG. 21, the phase is locked after T1 seconds from when the PLL circuit 1 is activated, and the time from when the PLL circuit 1 is activated to when the phase is locked is shortened to about one tenth of that of the example of FIG. 41. After locking the phase, the PLL circuit 1 shifts the operation mode from the high-speed lock mode to the normal lock mode. Thereby, in the stable state after the phase is locked, the PLL circuit 1 performs control of the oscillation signal including moderate control of the offset component of the oscillation frequency, so that the PLL circuit 1 can generate an oscillation signal of a highly accurate oscillation frequency.

In this way, when being activated, the PLL circuit 1 according to the first embodiment quickly locks the phase without performing the control of the offset component of the oscillation frequency of low response speed, and after locking the phase, the PLL circuit 1 performs the control of the offset component of the oscillation frequency of low response speed. Thereby, the PLL circuit 1 according to the first embodiment can quickly lock the phase.

(Application Example of PLL Circuit 1)

Figure 22:
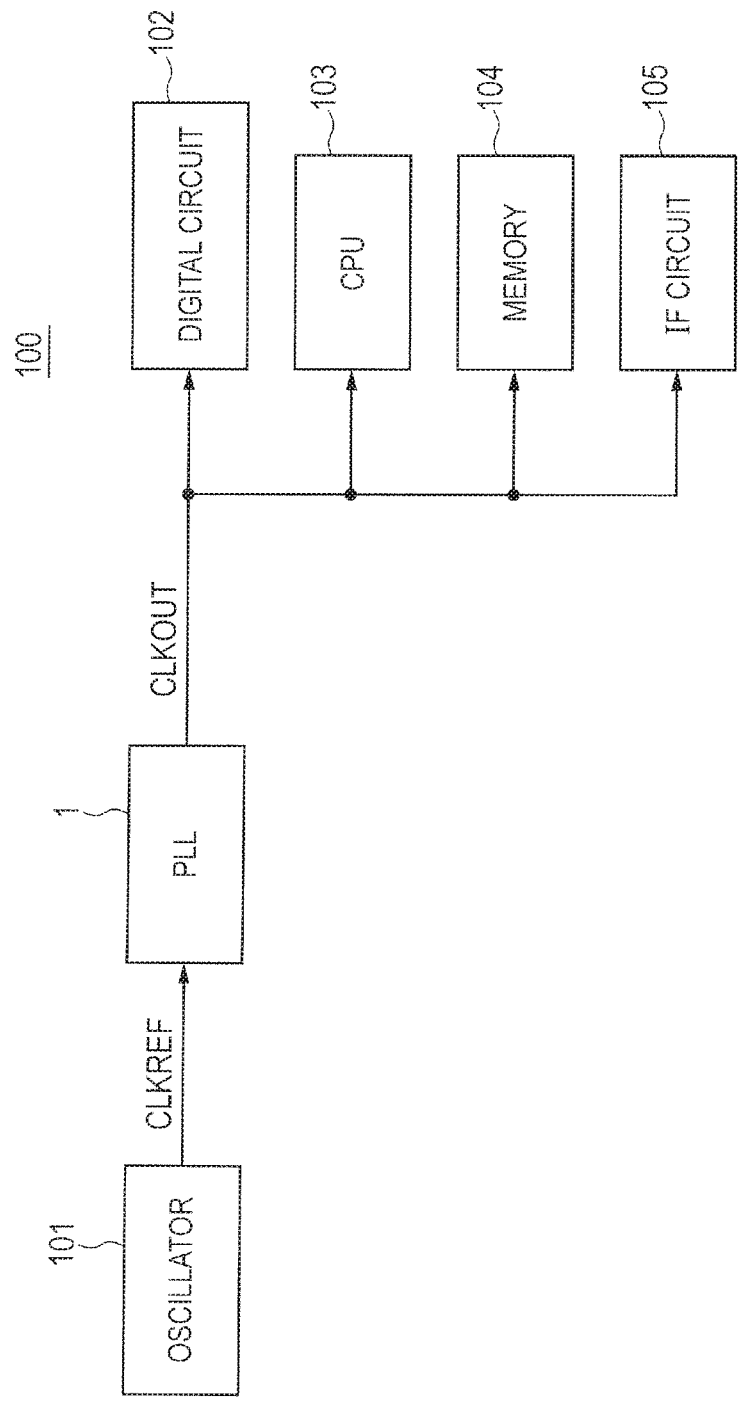
FIG. 22 is a block diagram showing a configuration example of a semiconductor device where the PLL circuit shown in FIG. 1 is mounted.

FIG. 22 is a block diagram showing a configuration example of a semiconductor device 100 where the PLL circuit 1 is applied. As shown in FIG. 22, the semiconductor device 100 includes the PLL circuit 1 and an oscillator 101 and further includes a digital circuit 102, a CPU 103, a memory 104, and an interface circuit 105 as part of an internal circuit.

The oscillator 101 is, for example, a crystal oscillator and generates the reference clock signal CLKREF. The PLL circuit 1 generates the output clock signal CLKOUT based on the reference clock signal CLKREF from the oscillator 101. All of the digital circuit 102, the CPU 103, the memory 104, and the interface circuit 105 operate in synchronization with the output clock signal CLKOUT.

Second Embodiment

Figure 23:
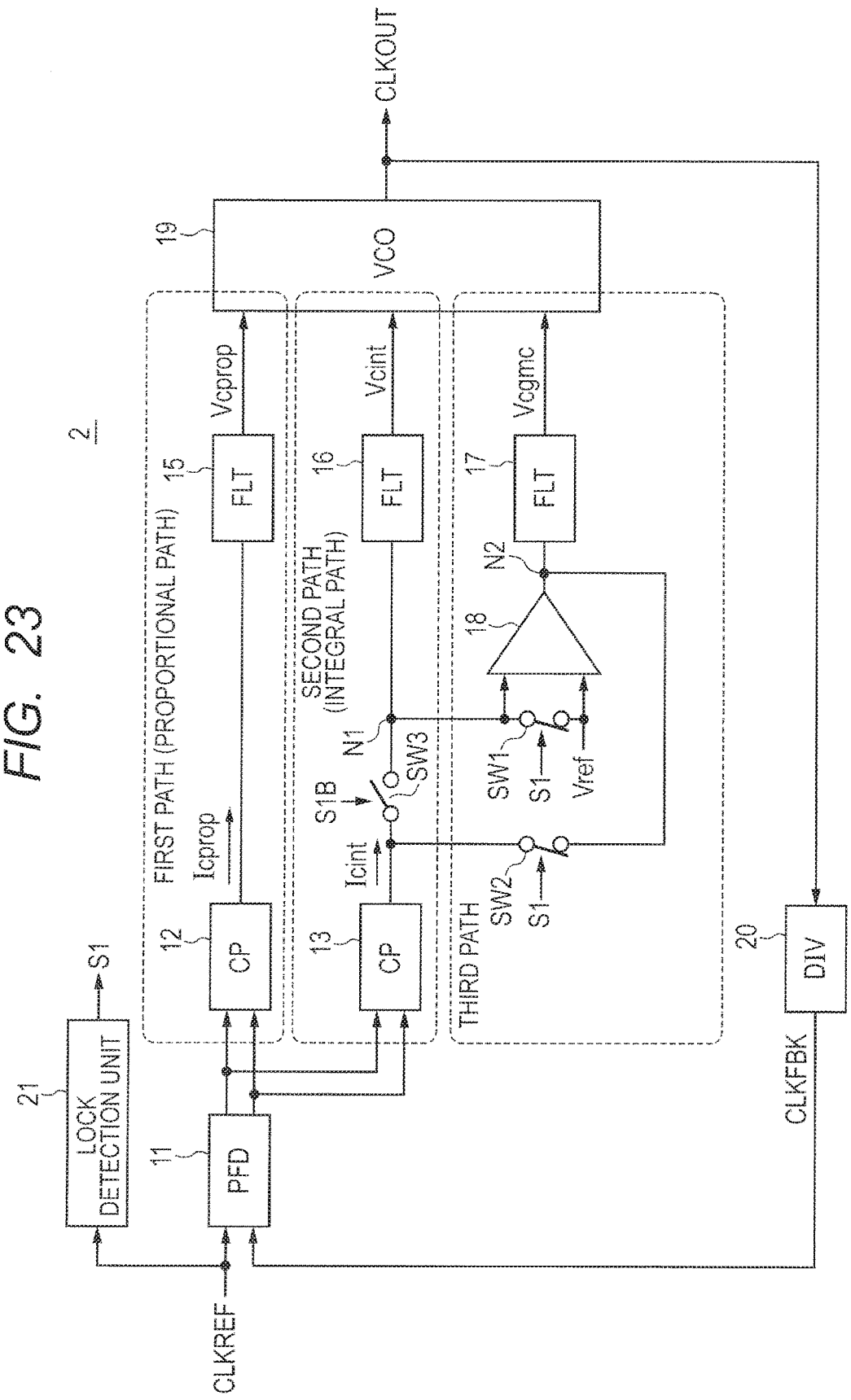
FIG. 23 is a diagram showing a configuration example of a PLL circuit according to a second embodiment.

FIG. 23 is a block diagram showing a PLL circuit 2 according to a second embodiment. The PLL circuit 2 does not include the charge pump 14 and further includes switch elements SW2 and SW3 as compared with the PLL circuit 1. A switch section is configured by the switch elements SW1 to SW3.

The switch element SW2 is provided between the output terminal of the charge pump 13 and the output terminal of the comparator 18 (the node N2) and is controlled to be turned on or off based on the mode switching signal S1. The switch element SW3 is provided between the output terminal of the charge pump 13 and the input terminal of the filter 16 (the node N1) and is controlled to be turned on or off based on the inversion signal S1B of the mode switching signal S1. For example, in the case of the high-speed lock mode, the switch elements SW1 and SW2 are turned on and the switch element SW3 is turned off. On the other hand, in the case of the normal lock mode, the switch elements SW1 and SW2 are turned off and the switch element SW3 is turned on. The other components of the PLL circuit 2 are the same as those of the PLL circuit 1, so the descriptions thereof are omitted.

It is preferable that the switch element SW1 has the largest possible on-resistance. For example, it is preferable that the on-resistance of the switch element SW1 is greater than at least the on-resistances of the switch elements SW2 and SW3. Thereby, it is possible to suppress a leak current flowing from the node N1 to the reference voltage terminal Vref through the switch element SW1 which is in an off state, so that the phase offset is suppressed.

(Operation of PLL Circuit 2)

Next, an operation of the PLL circuit 2 will be described.

(Operation of PLL Circuit 2 in High-Speed Lock Mode)

First, an operation of the PLL circuit 2 in the high-speed lock mode will be described. The high-speed lock mode is an operation mode including a period of time from when the PLL circuit 2 is activated to when the phase of the oscillation signal is locked. In the high-speed lock mode, a H level mode switching signal S1 is outputted from the lock detection unit 21.

Figure 24:
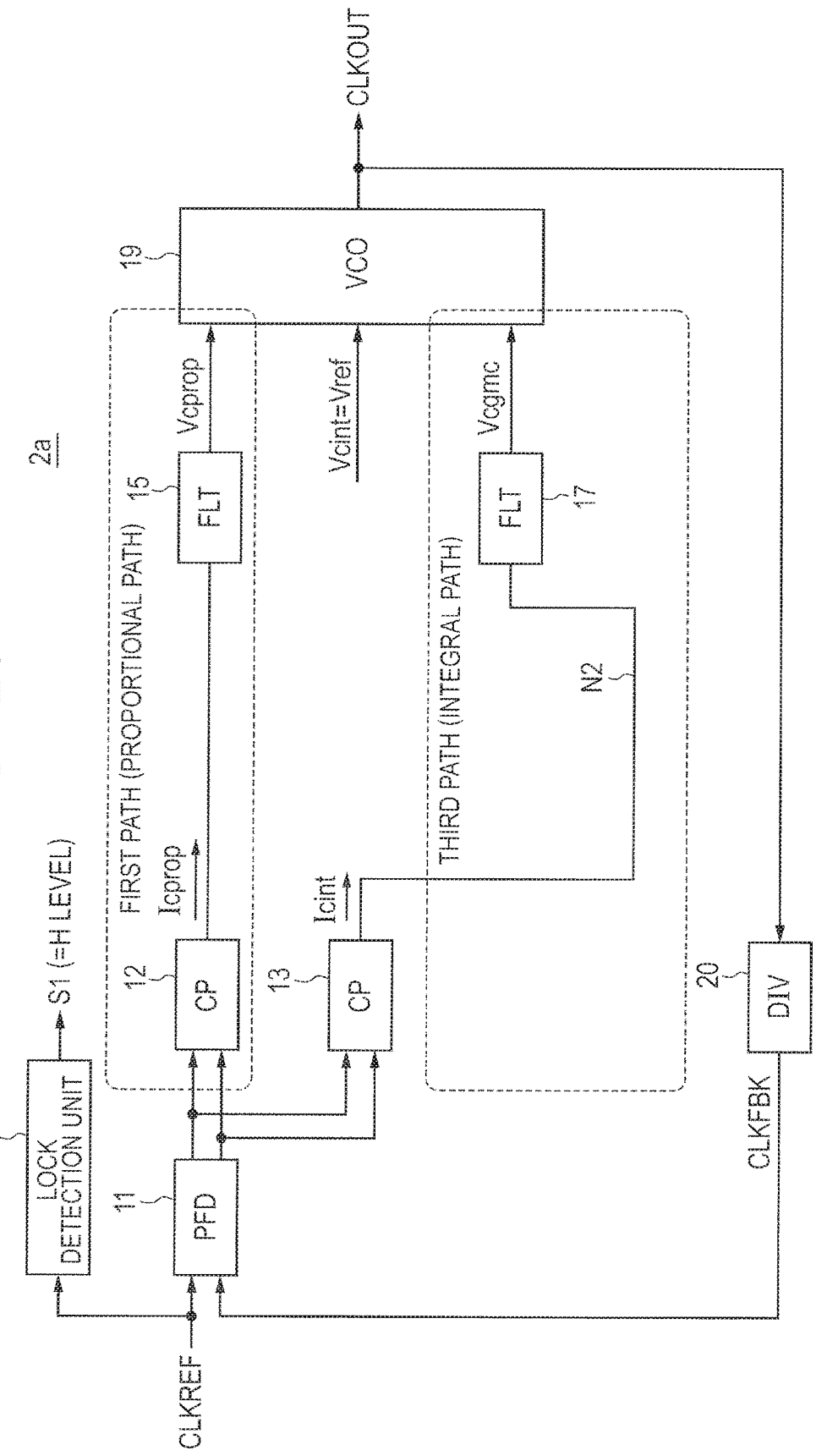
FIG. 24 is a diagram showing a configuration example of the PLL circuit shown in FIG. 23 in the high-speed lock mode.

FIG. 24 is a diagram showing an equivalent circuit of the PLL circuit 2 in the high-speed lock mode as a PLL circuit 2a. Here, in the high-speed lock mode, the switch elements SW1 and SW2 are controlled to be on and the switch element SW3 is controlled to be off, so that the voltage of the node N1 indicates the reference voltage Vref. The reference voltage Vref is supplied to the two input terminals of the comparator 18, so that the comparator 18 output no current. Therefore, it is possible to assume that the comparator 18 is not operating.

At this time, the filter 16 indicates the control voltage Vcint fixed to the reference voltage Vref.

Further, at this time, the output current Icint of the charge pump 13 is supplied to the node N2 through the switch element SW2. Therefore, the filter 17 generates the control voltage Vcgmc by integrating the current Icint outputted from the charge pump 13.

That is, the second path from the phase comparator 11 to the voltage controlled oscillator 19 through the charge pump 13 and the filter 16 is not used as an integral path for performing frequency control of the oscillation signal. On the other hand, the third path from the phase comparator 11 to the voltage controlled oscillator 19 through the charge pump 13 and the filter 17 is used as an integral path for performing frequency control of the oscillation signal.

The voltage controlled oscillator 19 mainly outputs an oscillation signal with a phase (and a frequency) according to the control voltage Vcprop and a frequency according to the control voltage Vcgmc. For example, the voltage controlled oscillator 19 outputs the oscillation signal so that the higher the control voltages Vcprop and Vcgmc, the higher the frequency of the oscillation signal, and the lower the control voltages Vcprop and Vcgmc, the lower the frequency of the oscillation signal. In the high-speed lock mode, the comparator 18 doses not function, so that control of an offset component of the oscillation frequency is not performed. Thereby, the voltage controlled oscillator 19 can quickly lock the phase without being restricted by moderate control of the offset component of the oscillation frequency.

(Operation of PLL Circuit 2 in Normal Lock Mode)

Next, an operation of the PLL circuit 2 in the normal lock mode will be described. The normal lock mode is an operation mode in a period of time after the phase of the oscillation signal is locked. In the normal lock mode, a L level mode switching signal S1 is outputted from the lock detection unit 21.

Figure 25:
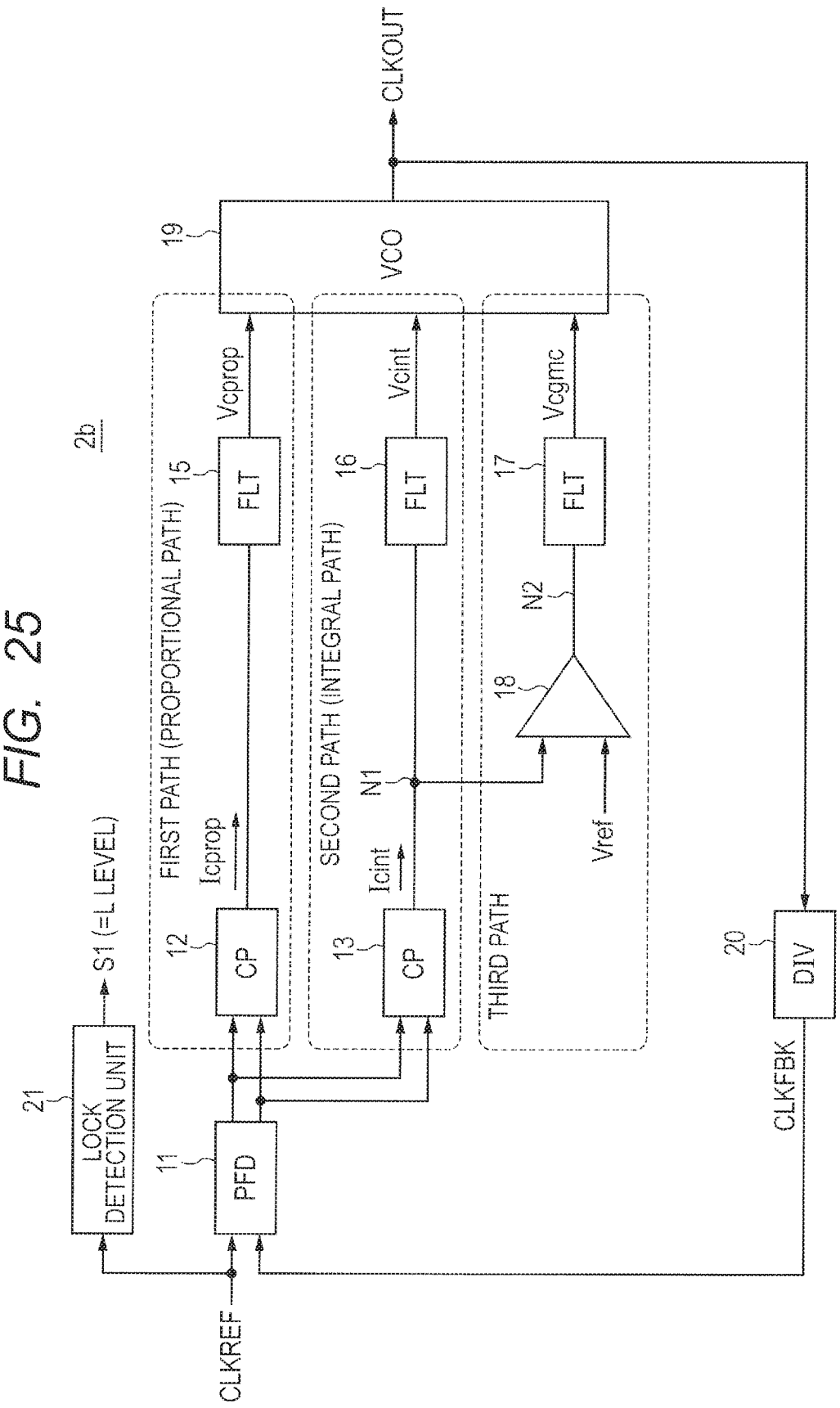
FIG. 25 is a diagram showing a configuration example of the PLL circuit shown in FIG. 23 in the normal lock mode.

FIG. 25 is a diagram showing an equivalent circuit of the PLL circuit 2 in the normal lock mode as a PLL circuit 2b. Here, in the normal lock mode, the switch elements SW1 and SW2 are controlled to be off and the switch element SW3 is controlled to be on, so that the current Icint of the charge pump 13 flows through the node N1.

At this time, the filter 16 generates the control voltage Vcint by integrating the output current Icint of the charge pump 13. Therefore, the voltage of the node N1 indicates the control voltage Vcint generated by integrating the current Icint by using the filter 16.

At this time, the comparator 18 compares the control voltage Vcint (the voltage of the node N1) generated by integrating the current Icint by using the filter 16 with the reference voltage Vref and outputs a comparison result. For example, when the control voltage Vcint is greater than the reference voltage Vref, the comparator 18 outputs a positive polarity current, when the control voltage Vcint is smaller than the reference voltage Vref, the comparator 18 outputs a negative polarity current, and when the control voltage Vcint indicates the reference voltage Vref, the comparator 18 outputs no current. The filter 17 generates the control voltage Vcgmc by integrating the comparison result of the comparator 18 (the current flowing through the node N2).

That is, the second path from the phase comparator 11 to the voltage controlled oscillator 19 through the charge pump 13 and the filter 16 is used as an integral path for performing frequency control of the oscillation signal. On the other hand, the third path from the phase comparator 11 to the voltage controlled oscillator 19 through the charge pump 13, the comparator 18, and the filter 17 is used as a second integral path for performing the control of the offset component of the oscillation frequency.

The voltage controlled oscillator 19 mainly outputs an oscillation signal with a phase (and a frequency) according to the control voltage Vcprop and a frequency according to the control voltages Vcint and Vcgmc. In the normal lock mode, the control of the offset component of the oscillation frequency is performed as described above. That is, in a stable state after the phase is locked, the voltage controlled oscillator 19 can generate an oscillation signal with a highly accurate oscillation frequency by performing control of the oscillation signal including moderate control of the offset component of the oscillation frequency.

As described above, the PLL circuit 2 according to the second embodiment can exert substantially the same effect as that of the PLL circuit 1. Specifically, when being activated, the PLL circuit 2 according to the second embodiment quickly locks the phase without performing the control of the offset component of the oscillation frequency of low response speed, and after locking the phase, the PLL circuit 2 performs the control of the offset component of the oscillation frequency of low response speed. Thereby, the PLL circuit 2 according to the second embodiment can quickly lock the phase.

Further, the PLL circuit 2 according to the second embodiment need not have the charge pump 14 as compared with the PLL circuit 1 according to the first embodiment, so that the circuit scale of the PLL circuit 2 can be further reduced. On the other hand, the PLL circuit 1 according to the first embodiment need not have the switch elements SW1 and SW2, so that the PLL circuit 1 can suppress increase in the leak current of the node N1. As a result, the PLL circuit 1 can suppress phase offset.

The charge pumps 12 and 13 may be configured to switch a maximum value of the currents Icprop and Icint according to an operation mode.

Third Embodiment

Figure 26:
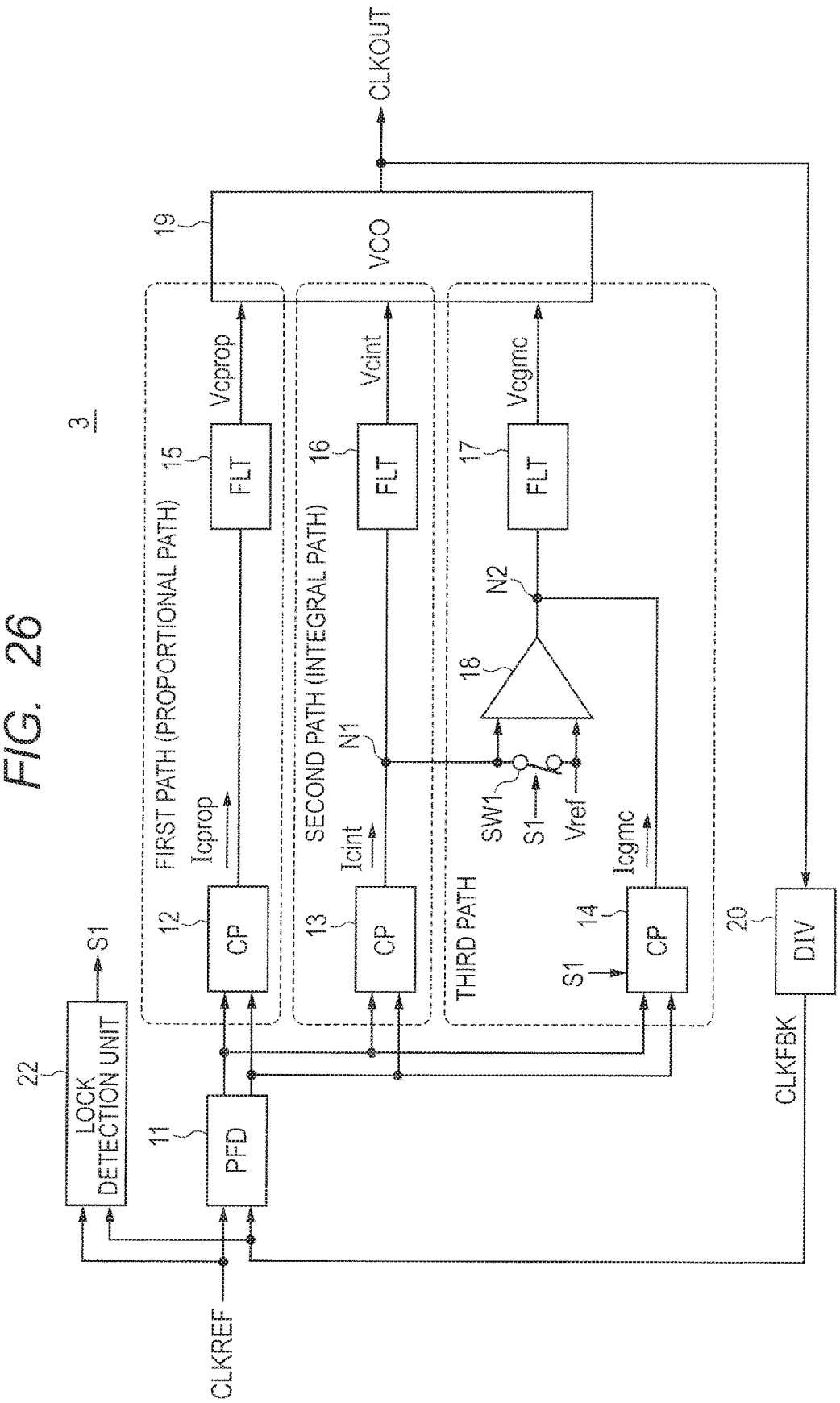
FIG. 26 is a diagram showing a configuration example of a PLL circuit according to a third embodiment.

FIG. 26 is a block diagram showing a PLL circuit 3 according to a third embodiment. The PLL circuit 3 includes a lock detection unit 22 instead of the lock detection unit 21 as compared with the PLL circuit 1.

The lock detection unit 22 detects whether or not the phase of the oscillation signal (the output clock signal CLKOUT) of the PLL circuit 3 is locked based on the reference clock signal CLKREF and the feedback clock signal CLKFBK.

For example, the lock detection unit 22 includes a first counter that counts the number of times the reference clock signal CLKREF rises, a second counter that counts the number of times the feedback clock signal CLKFBK rises, and a comparison circuit (mode switching circuit) that periodically compares a count value of the first counter and a count value of the second counter. The lock detection unit 22 determines that the phase of the oscillation signal is locked when the count values of the first and the second counters per one cycle are the same and switches the mode switching signal S1, for example, from H level to L level.

The other components of the PLL circuit 3 are the same as those of the PLL circuit 1, so the descriptions thereof are omitted.

As described above, the PLL circuit 3 according to the third embodiment can exert substantially the same effect as those of the PLL circuits 1 and 2 according to the first and the second embodiments. Further, the PLL circuit 3 according to the third embodiment can more accurately detect that the phase is locked by using the lock detection unit 22.

The lock detection unit 22 is not limited to be applied to the PLL circuit 1, but may also be applied to the PLL circuit 2.

In this way, when being activated, the PLL circuit 1 to 3 according to the first to the third embodiments quickly lock the phase without performing the control of the offset component of the oscillation frequency of low response speed, and after locking the phase, the PLL circuits 1 to 3 perform the control of the offset component of the oscillation frequency of low response speed. Thereby, the PLL circuit 1 to 3 according to the first to the third embodiments can quickly lock the phase.

While the invention made by the inventors has been specifically described based on the embodiments, it is needless to say that the present invention is not limited to the embodiments and may be variously modified without departing from the scope of the invention.

For example, the semiconductor device according to the embodiments described above may have a configuration where the conductivity type (p-type or n-type) of a semiconductor substrate, a semiconductor layer, a diffusion layer (diffusion region), and the like is inverted. Therefore, when it is defined that one of the n-type and the p-type is a first conductivity type and the other is a second conductivity type, it is possible to define that the first conductivity type is p-type and the second conductivity type is n-type, and on the contrary, it is also possible to define that the first conductivity type is n-type and the second conductivity type is p-type.

What is claimed is:

1. A PLL circuit comprising:
    a phase comparator that compares phases of a reference clock signal and a feedback clock signal;
    a first charge pump that generates a first current corresponding to a result of comparison by the phase comparator;
    a second charge pump that generates a second current corresponding to the result of comparison by the phase comparator;
    a first filter that generates a first control voltage obtained by removing ripple noise from a voltage generated based on the first current;

a comparator that compares a voltage of a first node with
  a reference voltage;
a switch section that selects and outputs the reference
  voltage to the first node and selects and outputs the
  second current to the second node in the case of a first
  mode and selects and outputs the second current to the
  first node and selects and outputs a result of comparison
  by the comparator to the second node in the case of a
  second mode;
a second filter that generates a second control voltage by
  integrating a current flowing through the first node;
a third filter that generates a third control voltage by
  integrating a current flowing through the second node;
a voltage controlled oscillator that generates an output
  clock signal of a frequency corresponding to the first to
  the third control voltages; and
a frequency divider that frequency-divides the output
  clock signal and outputs the frequency-divided output
  clock signal as the feedback clock signal.

2. The PLL circuit according to claim 1, further comprising:
a third charge pump that is driven in the case of the first
  mode and generates a third current proportional to the
  second current,
wherein the switch section has a first switch element
  which is provided between a reference voltage terminal
  to which the reference voltage is supplied and the first
  node and which turns on in the case of the first mode
  and turns off in the case of the second mode, and
wherein in the case of the first mode, the third current
  outputted from the third charge pump is supplied to the
  second node.

3. The PLL circuit according to claim 2,
wherein the third charge pump has
a first constant current source provided between a power
  supply voltage terminal and an output terminal of the
  third charge pump,
a first current supply control switch that is provided in
  series to the first constant current source between the
  power supply voltage terminal and the output terminal
  and is controlled to be on or off according to the result
  of comparison by the phase comparator,
a second constant current source provided between a
  ground voltage terminal and the output terminal,
a second current supply control switch that is provided in
  series to the second constant current source between the
  ground voltage terminal and the output terminal and is
  controlled to be on or off according to the result of
  comparison by the phase comparator,
a third current supply control switch which is provided in
  series to the first constant current source between the
  power supply voltage terminal and the output terminal
  and which turns on in the case of the first mode and
  turns off in the case of the second mode, and
a fourth current supply control switch which is provided
  in series to the second constant current source between
  the ground voltage terminal and the output terminal and
  which turns on in the case of the first mode and turns
  off in the case of the second mode.

4. The PLL circuit according to claim 2,
wherein the third charge pump has
a mask circuit that masks the result of comparison by the
  phase comparator in the case of the second mode,
a first constant current source provided between a power
  supply voltage terminal and an output terminal of the
  third charge pump,
a first current supply control switch that is provided in
  series to the first constant current source between the
  power supply voltage terminal and the output terminal
  and is controlled to be on or off according to an output
  of the mask circuit,
a second constant current source provided between a
  ground voltage terminal and the output terminal, and
a second current supply control switch that is provided in
  series to the second constant current source between the
  ground voltage terminal and the output terminal and is
  controlled to be on or off according to an output of the
  mask circuit.

5. The PLL circuit according to claim 2,
wherein the second charge pump is configured to be
  driven only in the case of the second mode.

6. The PLL circuit according to claim 5,
wherein the second charge pump has
a first constant current source provided between a power
  supply voltage terminal and an output terminal of the
  second charge pump,
a first current supply control switch that is provided in
  series to the first constant current source between the
  power supply voltage terminal and the output terminal
  and is controlled to be on or off according to the result
  of comparison by the phase comparator,
a second constant current source provided between a
  ground voltage terminal and the output terminal,
a second current supply control switch that is provided in
  series to the second constant current source between the
  ground voltage terminal and the output terminal and is
  controlled to be on or off according to the result of
  comparison by the phase comparator,
a third current supply control switch which is provided in
  series to the first constant current source between the
  power supply voltage terminal and the output terminal
  and which turns off in the case of the first mode and
  turns on in the case of the second mode, and
a fourth current supply control switch which is provided
  in series to the second constant current source between
  the ground voltage terminal and the output terminal and
  which turns off in the case of the first mode and turns
  on in the case of the second mode.

7. The PLL circuit according to claim 5,
wherein the second charge pump has
a mask circuit that masks the result of comparison by the
  phase comparator in the case of the first mode,
a first constant current source provided between a power
  supply voltage terminal and an output terminal of the
  second charge pump,
a first current supply control switch that is provided in
  series to the first constant current source between the
  power supply voltage terminal and the output terminal
  and is controlled to be on or off according to an output
  of the mask circuit,
a second constant current source provided between a
  ground voltage terminal and the output terminal, and
a second current supply control switch that is provided in
  series to the second constant current source between the
  ground voltage terminal and the output terminal and is
  controlled to be on or off according to an output of the
  mask circuit.

8. The PLL circuit according to claim 1, further comprising:
a third charge pump that generates a third current proportional to the second current,
wherein the switch section has a first switch element which is provided between a reference voltage terminal to which the reference voltage is supplied and the first node and which turns on in the case of the first mode and turns off in the case of the second mode, and a second switch element which is provided between an output of the third charge pump and the second node and which turns on in the case of the first mode and turns off in the case of the second mode, and wherein in the case of the first mode, the third current outputted from the third charge pump is supplied to the second node.

9. The PLL circuit according to claim 8, wherein it is configured so that an on-resistance of the first switch element is greater than an on-resistance of the second switch element.

10. The PLL circuit according to claim 1, wherein the switch section has a first switch element which is provided between a reference voltage terminal to which the reference voltage is supplied and the first node and which turns on in the case of the first mode and turns off in the case of the second mode, a second switch element which is provided between an output of the third charge pump and the second node and which turns on in the case of the first mode and turns off in the case of the second mode, and a third switch element which is provided between the output of the second charge pump and the first node and which turns off in the case of the first mode and turns on in the case of the second mode.

11. The PLL circuit according to claim 10, wherein it is configured so that an on-resistance of the first switch element is greater than an on-resistance of each of the second and the third switch elements.

12. The PLL circuit according to claim 1, wherein the first mode is a predetermined period of time from when the PLL circuit is activated, and wherein the second mode is a remaining period of time after the predetermined period of time elapses.

13. The PLL circuit according to claim 1, further comprising:

a lock detection unit, wherein the lock detection unit has a counter that counts the number of times the reference clock signal rises, and a mode switching circuit that switches a mode from the first mode to the second mode when a count value of the counter reaches a predetermined value.

14. The PLL circuit according to claim 1, further comprising:

a lock detection unit, wherein the lock detection unit has a first counter that counts the number of times the reference clock signal rises, a second counter that counts the number of times the feedback clock signal rises, and a mode switching circuit that switches a mode from the first mode to the second mode when periodic count values of the first counter and the second counter are coincident.

15. The PLL circuit according to claim 1, wherein the first filter has a first resistive element provided between an output of the first charge pump and a ground voltage terminal, and a first capacitative element provided in parallel with the first resistive element.

16. The PLL circuit according to claim 1, wherein the second filter has a second capacitative element provided between the first node and a ground voltage terminal.

17. The PLL circuit according to claim 1, wherein the third filter has a third capacitative element provided between the second node and a ground voltage terminal.

18. A PLL circuit comprising:

a phase comparator that compares phases of a reference signal and a feedback signal;

a first charge pump that generates a first current corresponding to a result of comparison by the phase comparator;

a second charge pump that generates a second current corresponding to the result of comparison by the phase comparator;

a first filter that generates a first control voltage based on the first current;

a comparator that compares a voltage of a first node with a reference voltage;

a first switch element coupled between the first node and a reference voltage terminal to which the reference voltage of the comparator is supplied;

a second switch element coupled between a second node to which an output terminal of the comparator is coupled and an output terminal of the second charge pump;

a third switch element coupled between the output terminal of the second charge pump and the first node;

a second filter that generates a second control voltage based on a current flowing through the first node; a third filter that generates a third control voltage based on a current flowing through the second node;

a voltage control oscillator that generates an output signal of a frequency corresponding to the first to the third control voltages; and a frequency divider that frequency-divides the output signal and outputs the frequency-divided output signal as the feedback signal.

19. The PLL circuit according to claim 18, wherein the first switch element, the second switch element and the third switch element configure a switch section, and wherein in the case of a first mode, the switch section selects and outputs the reference voltage to the first node and selects and outputs the second current to the second node, and in the case of a second mode, the switch section selects and outputs the second current to the first node and selects and outputs a result of comparison by the comparator to the second node.

20. The PLL circuit according to claim 19, wherein the first control voltage is obtained by removing ripple noise by the first filter.

* * * * *